US012396273B2

(12) United States Patent
Goto

(10) Patent No.: US 12,396,273 B2
(45) Date of Patent: Aug. 19, 2025

(54) IMAGE SENSOR STRUCTURE FOR REDUCED PIXEL PITCH AND METHODS THEREOF

(71) Applicant: OMNIVISION TECHNOLOGIES, INC., Santa Clara, CA (US)

(72) Inventor: Takayuki Goto, Foster City, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 615 days.

(21) Appl. No.: 17/886,945

(22) Filed: Aug. 12, 2022

(65) Prior Publication Data

US 2024/0055463 A1 Feb. 15, 2024

(51) Int. Cl.
*H10F 39/18* (2025.01)
*H10F 39/00* (2025.01)

(52) U.S. Cl.
CPC .......... *H10F 39/18* (2025.01); *H10F 39/014* (2025.01); *H10F 39/802* (2025.01); *H10F 39/807* (2025.01); *H10F 39/811* (2025.01)

(58) Field of Classification Search
None
See application file for complete search history.

(56) References Cited

U.S. PATENT DOCUMENTS

| 7,323,754 | B2 | 1/2008 | Ema et al. |
| 9,025,063 | B2 | 5/2015 | Ahn et al. |
| 9,165,959 | B2 | 10/2015 | Chen et al. |
| 10,070,081 | B2 | 9/2018 | Mo et al. |
| 10,103,190 | B2 | 10/2018 | Korobov et al. |
| 10,438,989 | B2 * | 10/2019 | Kim ..................... H10F 39/809 |
| 2010/0173444 | A1 * | 7/2010 | Mishima ............... H10F 39/014 257/E31.084 |
| 2010/0176276 | A1 * | 7/2010 | Ihara ..................... H10F 39/199 250/214 R |
| 2021/0082983 | A1 | 3/2021 | Kadura et al. |

FOREIGN PATENT DOCUMENTS

| EP | 3886144 A1 | 9/2021 |
| WO | 2020105713 A1 | 5/2020 |

OTHER PUBLICATIONS

Vincent C. Venezia, et al., 1.5 µm Dual Conversion Gain, Backside Illuminated Image Sensor Using Stacked Pixel Level Connections with 13ke—Full-Well Capacitance and 0.8e—Noise, 2018, OmniVision Technologies, Santa Clara CA, 4 pages.
Vincent C. Venezia, et al., Second Generation Small Pixel Technology Using Hybrid Bond Stacking, OmniVision Technologies, Inc., Sensors, 2018, Santa Clara, CA, 8 pages.
U.S. Appl. No. 17/886,955, filed Aug. 12, 2022, 76 pages.

* cited by examiner

*Primary Examiner* — Hung K Vu
(74) *Attorney, Agent, or Firm* — Christensen O'Connor Johnson Kindness PLLC

(57) ABSTRACT

A pixel cell for an image sensor including a first semiconductor substrate, a photodiode, and a transfer gate is described. The first semiconductor substrate includes a first side and a second side. The first side is opposite the second side. The photodiode is disposed within the first semiconductor substrate between the first and the second side. The transfer gate is disposed proximate to the first side of the first semiconductor substrate. The transfer gate includes a planar region. The first side of the semiconductor substrate is disposed between the planar region and the photodiode. A lateral area of the photodiode is less than or equal to a lateral area of the planar region of the transfer gate.

23 Claims, 18 Drawing Sheets

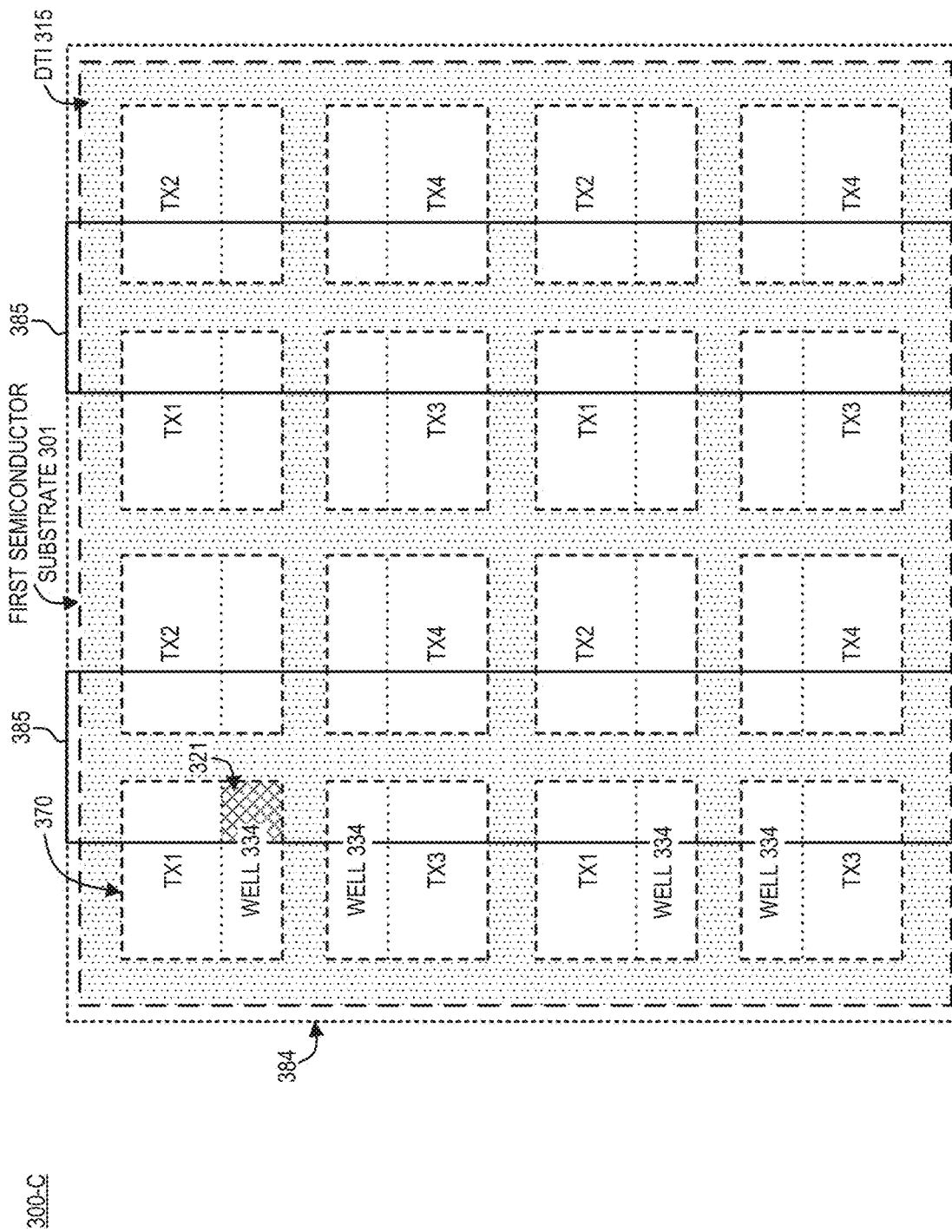

IMAGE SENSOR STRUCTURE FOR REDUCED PIXEL PITCH AND METHODS THEREOF

TECHNICAL FIELD

This disclosure relates generally to image sensors, and in particular but not exclusively, relates to CMOS image sensors and applications thereof.

BACKGROUND INFORMATION

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bit lines that vary as a function of the incident image light. In other words, the amount of image charge generated is proportional to the intensity of the image light, which is readout as analog image signals from the column bit lines and converted to digital values to produce digital images (i.e., image data) representative of the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

FIGS. 3A-3G illustrate an example method for forming the first semiconductor substrate of the imaging system illustrated in FIG. 2A, in accordance with embodiments of the disclosure.

DETAILED DESCRIPTION

Embodiments of an apparatus, system, and method each related to an image sensor structure for reduced pixel pitch are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1:
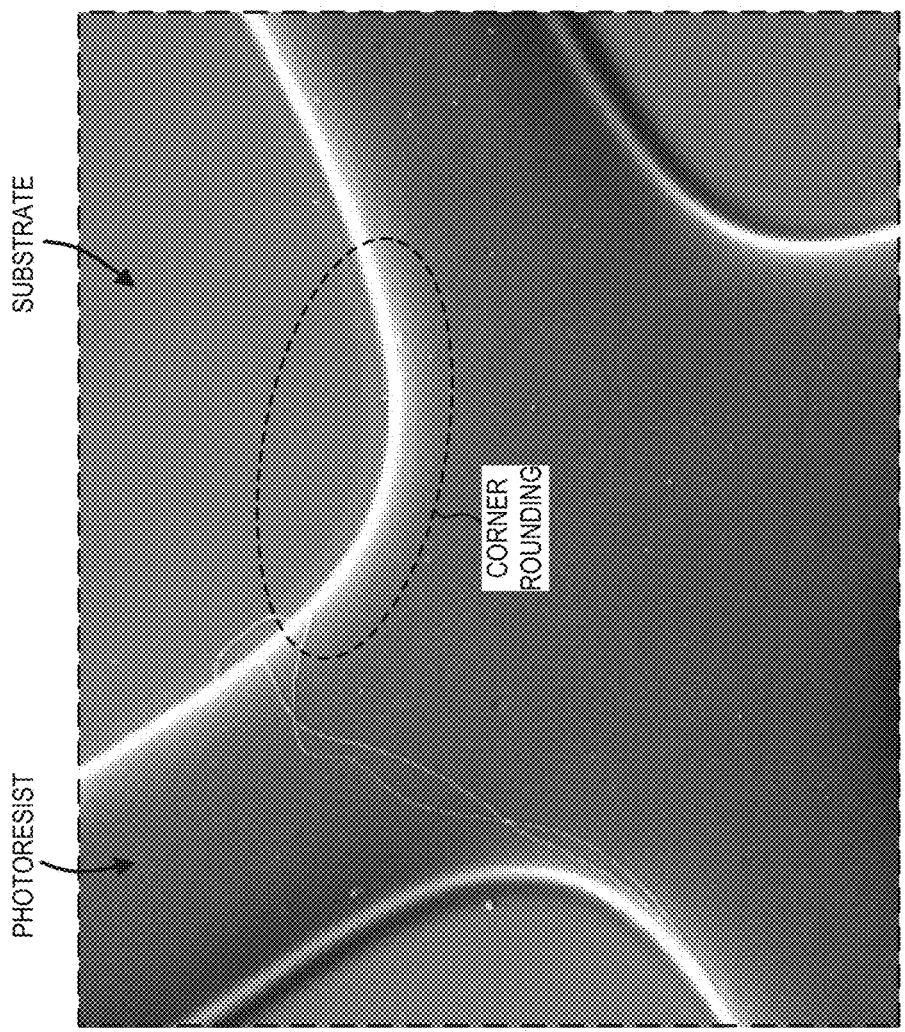
FIG. 1 illustrates an image of patterned photoresist deposited on a substrate with corner rounding for explaining a problem faced by conventional image sensors.

FIG. 1 illustrates an image 100 of patterned photoresist deposited on a substrate with corner rounding for explaining a problem faced by conventional image sensors. Achieving a ninety-degree corner pattern remains challenging with conventional lithographic techniques used in complementary metal-oxide semiconductor (CMOS) technology. The corner rounding of patterned photoresist that results may lead to processing variance, which in turn may lead to performance variance in devices being fabricated on the same or different semiconductor wafers. For example, CMOS technology commonly uses ion implantation, in which ions (e.g., boron, phosphorus, or other dopants) are implanted within regions of the semiconductor wafer to selectively doped the regions of the semiconductor wafer. However, implantation near the corner rounding of patterned photoresist may be inconsistent or otherwise vary dependent on how much corner rounding is present. Additionally, the degree of corner rounding for the patterned photoresist may not be uniform across the semiconductor wafer, which may further contribute to variance in devices fabricated on a common semiconductor wafer and/or devices fabricated on different semiconductor wafers. Moreover, as devices with smaller feature sizes are fabricated, the influence of processing variance, due to patterned photoresist with corner rounding, on the performance of said devices may increase. Further still, as feature sizes decrease, the degree of corner rounding in patterned photoresist to support the decreased feature sizes may increase and result in feature size restrictions, which may be expressed as design rule requirements dependent on the technology node being used. For example, it remains challenging to fabricate image sensors with a pixel pitch in a sub-micron range (e.g., less than 0.6 μm) when utilizing a 45 nm technology node.

Described herein are embodiments of an image sensor structure to enable reduced pixel pitch and mitigate the effects of corner rounding in patterned photoresist. Advantageously, the image sensor structure described in embodiments of the disclosure can be utilized to fabricate image sensors with a pixel pitch of less than 0.5 μm with reduced process variance attributed to corner rounding of patterned photoresist while still maintaining a photosensitive area (e.g., relative to the total pixel area of the image sensor) of greater than twenty-five percent. In some embodiments, this is achieved in part by a multi-substrate image sensor in which multiple semiconductor substrates are utilized to form an image sensor package. However, it is appreciated that in other embodiments, an image sensor with reduced pixel pitch may also be achieved with an individual semiconductor substrate or wafer. It is further appreciated that the term "semiconductor substrate" throughout the disclosure may correspond to a part of or an entirety of a semiconductor wafer (e.g., a silicon wafer). In some embodiments, the semiconductor substrate includes or is otherwise formed of silicon, a silicon germanium alloy, germanium, a silicon carbide alloy, an indium gallium arsenide alloy, any other alloys formed of III-V group compounds, combinations thereof, or a bulk substrate thereof.

Figure 2A:
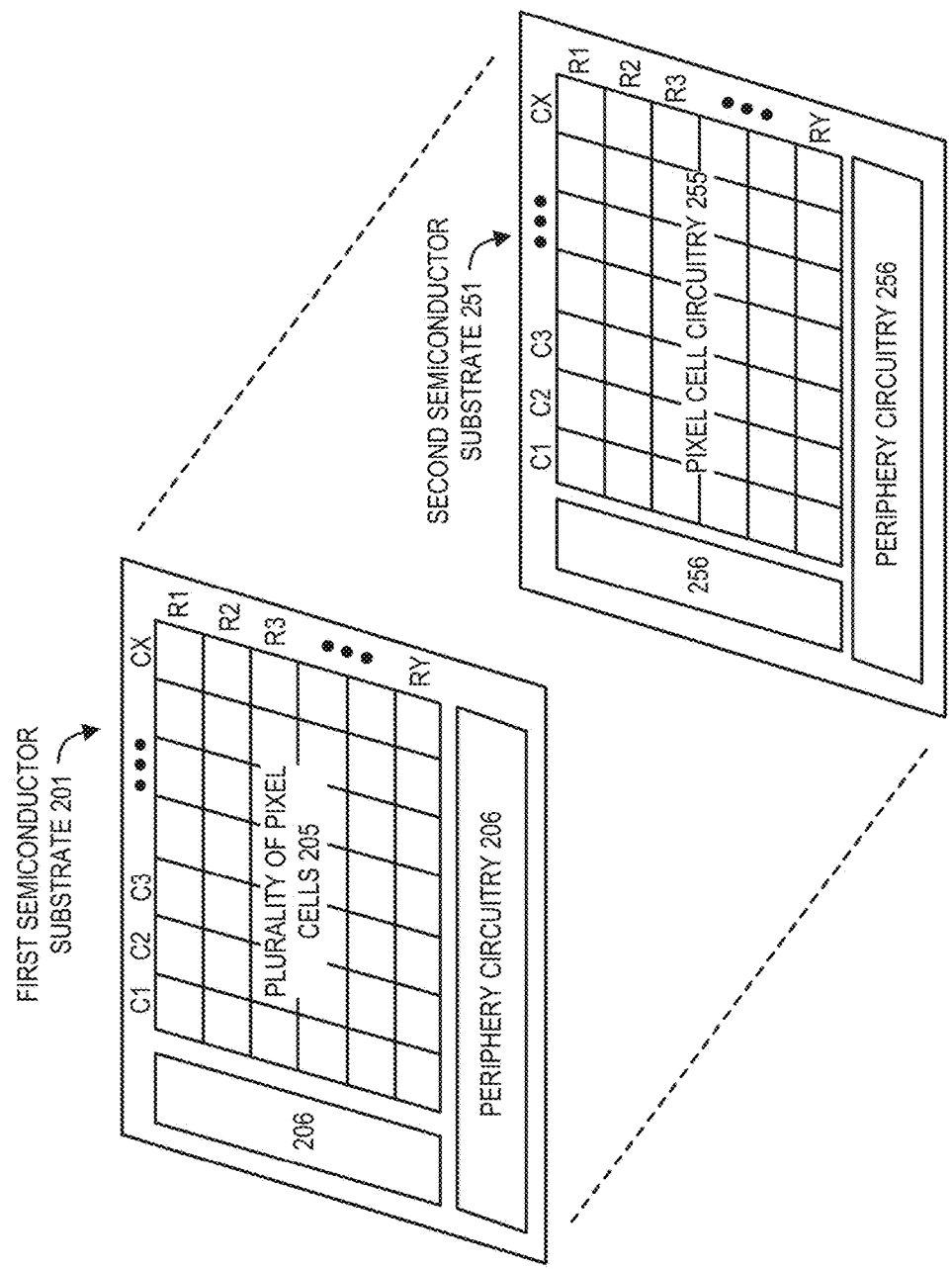
FIG. 2A illustrates an example imaging system including multiple semiconductor substrates and a structure to enable reduced pixel pitch, in accordance with embodiments of the present disclosure.

FIG. 2A illustrates an example imaging system 200 including multiple semiconductor substrates and a structure to enable reduced pixel pitch, in accordance with embodiments of the present disclosure. The imaging system 200 includes a first semiconductor substrate 201 and a second semiconductor substrate 251, each of which may correspond to a part of or an entirety of a semiconductor wafer in accordance with embodiments of the disclosure. The first semiconductor substrate 201 includes a plurality of pixel cells 205 and periphery circuitry 206. In some embodiments, each pixel cell included in the plurality of pixel cells 205 includes one or more pixels (see, e.g., FIG. 2C), which may share a common color filter (e.g., a group of four adjacent pixels arranged in a two-by-two pattern and optically aligned with a first color filter may form a first pixel cell included in the plurality of pixel cells 205). The second semiconductor substrate 251 includes pixel cell circuitry 255 and periphery circuitry 256. In some embodiments, the pixel cell circuitry 255 may be segmented into groups of components that are associated with respective pixel cells included in the plurality of pixel cells 205 to facilitate operation and/or readout for the imaging system 200 (see, e.g., FIGS. 2E-2H).

In the illustrated embodiment of FIG. 2A, the imaging system 200 is a stacked complementary metal-oxide semiconductor (CMOS) image sensor formed, at least in part, by the first semiconductor substrate 201 (e.g., a first die) and the second semiconductor substrate 251 (e.g., a second die) that are stacked and coupled together (e.g., electrically and/or physically) in a stacked chip scheme achieved via bonding (e.g., oxide bonding, metal bonding, hybrid bonding), silicon connections (e.g., through silicon vias), other suitable circuit coupling technologies, or combinations thereof. It is appreciated that while only the first semiconductor substrate 201 and the second semiconductor substrate 251 are illustrated in FIG. 2A, the stacked chip scheme of the imaging system 200 may include additional substrates (e.g., one or more additional substrates, dies, or chips different from the first semiconductor substrate 201 and the second semiconductor substrate 251) that may be integrated into the stacked chip scheme of the imaging system 200. Additionally, it is appreciated that the view presented in FIG. 2A may omit certain elements of the imaging system 200 to avoid obscuring details of the disclosure. In other words, not all elements of the imaging system 200 may be labeled, illustrated, or otherwise shown within FIG. 2A or other figures throughout the disclosure. It is further appreciated that in some embodiments, the imaging system 200 may not necessarily include all elements shown (e.g., when the imaging system 200 is not a stacked chip scheme, then the second semiconductor substrate 251 may be omitted while the pixel cell circuitry 255 and the periphery circuitry 256 may be disposed in or on the first semiconductor substrate 201).

Referring to the illustrated embodiment of FIG. 2A, the stacked chip scheme distributes components of the imaging system 200 across multiple substrates. Specifically, the first semiconductor substrate 201 includes photosensitive elements (e.g., a plurality of photodiodes such as pinned photodiodes or the like to form pixels) included in a plurality of pixel cells 205 while the second semiconductor substrate 251 includes pixel cell circuitry 255 associated with the plurality of pixel cells 205 (e.g., any one of or a combination of pixel transistors such as reset transistors, source-follower transistors, row select transistors, and so on, analog to digital circuitry, signal processing circuitry, or other circuitry to facilitate imaging an external scene with the pixels included in the plurality of pixel cells 205). Put in another way, the second semiconductor substrate 251 offloads at least part of the circuitry associated with the plurality of pixel cells 205 from the first semiconductor substrate 201, which advantageously provides additional space on the first semiconductor substrate 201 (e.g., to reduce pixel pitch, increase photodiode sensing area relative to total pixel area, and so on).

In some embodiments, the plurality of pixel cells 205 may be coupled to the pixel cell circuitry 255 through one or more hybrid bonds, through-silicon vias, other suitable circuitry coupling technologies, or combinations thereof. In some embodiments, the space saved on the first semiconductor substrate 201 by offloading circuitry to the second semiconductor substrate 251 (or other subsequent substrates in the stacked chip scheme) may be repurposed to increase the size of individual photodiodes included in each of the pixels included in the plurality of pixel cells 205 to allow for increased pixel size, density, sensitivity, combinations thereof, or the like. Additionally, or alternatively, functionality of the imaging system 200 may be facilitated as the second semiconductor substrate 251 may have room for additional components or circuitry that may not otherwise fit on an individual substrate that contains both the plurality of pixel cells 205 and the pixel cell circuitry 255 without affecting the performance and/or functionality of the imaging system 200.

In the illustrated embodiment, the imaging system 200 comprises the first semiconductor substrate 201 and the second semiconductor substrate 251 coupled to the first semiconductor substrate 201. The first semiconductor substrate 201 includes the plurality of pixel cells 205, which are arranged in rows (e.g., R1, R2, R3, . . . RY) and columns (e.g., C1, C2, C3, . . . CX) to form an array of pixel cells. Each of the plurality of pixel cells 205 may include any number of pixels (e.g., one, two, four, eight, or more pixels per pixel cell). In most embodiments, the number of pixels per pixel cell included in the plurality of pixel cells 205 is uniform. In one embodiment, each pixel cell included in the plurality of pixel cells 205 have a regular arrangement (e.g., a two-by-two arrangement of four pixels, a two-by-three arrangement of six pixels, a two-by-four arrangement of eight pixels, a four-by-four arrangement of sixteen pixels, or otherwise). In some embodiments, an individual pixel cell included in the plurality of pixel cells 205 may correspond to a minimal repeating unit of the first semiconductor substrate 201, or more specifically, the plurality of pixel cells 205. In other embodiments, a group of pixel cells included in the plurality of pixel cells 205 may correspond to a minimal repeating unit of the first semiconductor substrate 201 and/or the plurality of pixel cells 205 (e.g., a two-by-two group of pixel cells included in the plurality of pixel cells 205 may correspond to a minimal repeating unit). In some embodiments, the pixel cell circuitry 255 of the second semiconductor substrate 251 is arranged based on a corresponding arrangement of the plurality of pixel cells 205. For example, in some embodiments, individual pixel cells included in the plurality of pixel cells 205 of the first semiconductor substrate 201 may be respectively coupled to individual groups of components included in the pixel cell circuitry 255 of the second semiconductor substrate 251 on a per-pixel or per-pixel cell basis, which may result in an arrangement of the pixel cell circuitry 255 being regular and/or repeating (e.g., in rows and columns as illustrated).

As illustrated in FIG. 2A, the first semiconductor substrate 201 and the second semiconductor substrate 251 include various analog and/or digital support circuitry for the imaging system 200, respectively corresponding to the periphery circuitry 206 and the periphery circuitry 256. In some embodiments, support circuitry that may be included in the periphery circuitry 206 and/or the periphery circuitry 256 may include, but is not limited to, row and column decoders and drivers, analog signal processing chains, digital imaging processing blocks, memory, timing and control circuits, input/output interfaces, a vertical scanner, sample and hold circuitry, amplifiers, analog-to-digital converter circuitry, and any other embodiments of logic and/or circuitry that is appropriate for the function of the imaging system 200.

Figure 2B:
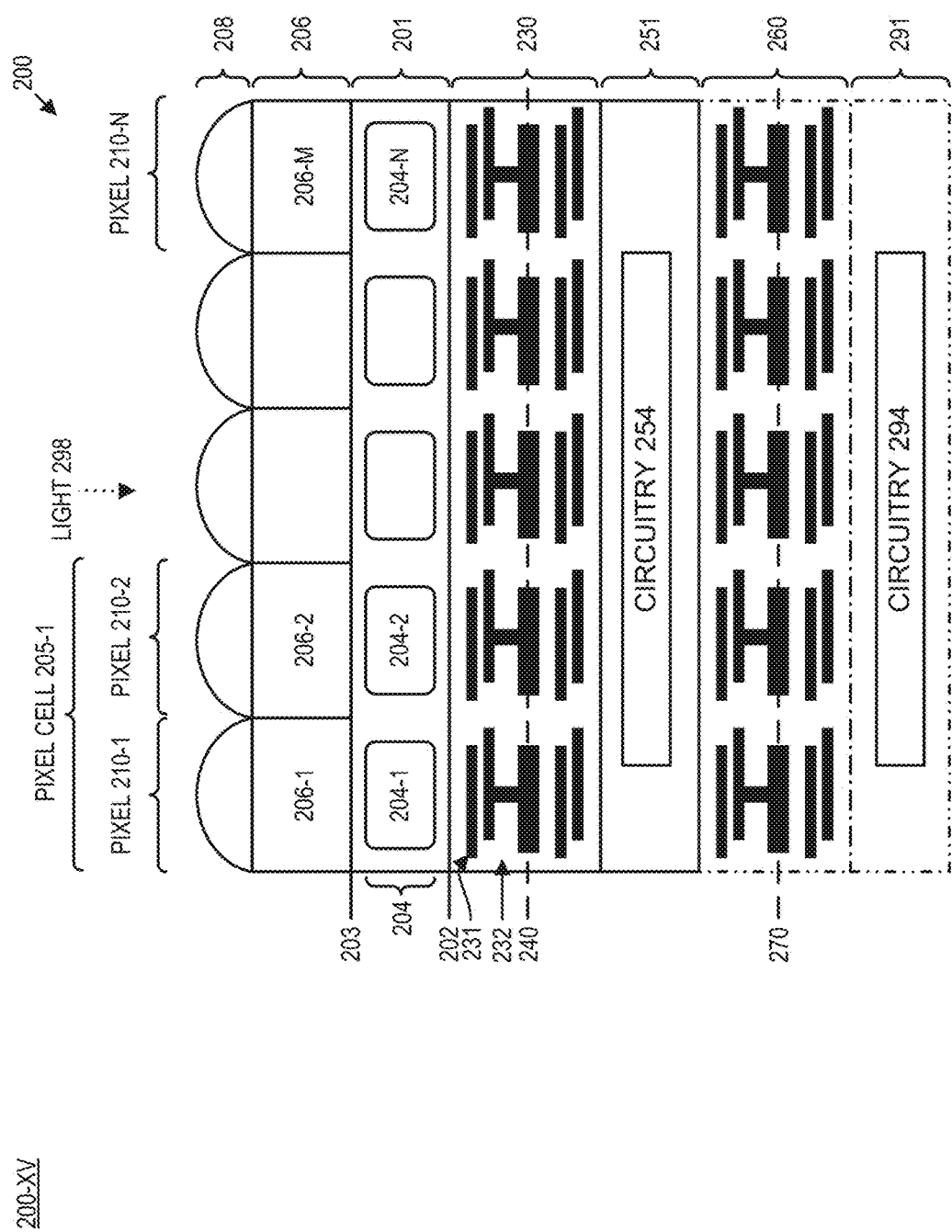
FIG. 2B illustrates a cross-sectional view of the example imaging system of FIG. 2A, in accordance with embodiments of the present disclosure.

FIG. 2B illustrates a cross-sectional view 200-XV of the example imaging system 200 of FIG. 2A, in accordance with an embodiment of the present disclosure. The imaging system 200 includes the first semiconductor substrate 201, the second semiconductor substrate 251, and optionally a third semiconductor substrate 291. As illustrated, the second semiconductor substrate 251 is disposed between the first semiconductor substrate 201 and the optional third semiconductor substrate 291. The first semiconductor substrate 201 is coupled to the second semiconductor substrate 251 at interface 240 via metallization layer 230, which includes one or more metal layers 231 disposed between one or more intermetal dielectric layers 232 (e.g., in the form one or more hybrid bonds). In some embodiments, other stacking connection schemes may be utilized in addition to, or in place of hybrid bonding, such as through-silicon vias, a combination of hybrid bonding and through-silicon vias, or other suitable circuitry coupling technologies. It is appreciated that in the illustrated embodiment, the metallization layer 260 similarly couples the second semiconductor substrate 251 to the optional third semiconductor substrate 291 at interface 270.

As illustrated, the imaging system 200 further includes a plurality of photodiodes 204 (e.g., a first photodiode 204-1, a second photodiode 204-2, and so on until a Nth photodiode 204-N, where "N" corresponds to the total number of photodiodes included in the plurality of photodiodes 204) disposed between a first side 202 (e.g., a front side or a backside) and a second side 203 (e.g., a backside or a front side) opposite the first side 202 of the first semiconductor substrate 201, a plurality of color filters 206 (e.g., a first color filter 206-1, a second color filter 206-2, and so on until a Mth color filter 206-M, where "M" corresponds to the total number of color filters included in the plurality of color filters 206), and a plurality of microlenses 208 to collectively form a plurality of pixels 210 (e.g., a first pixel 210-1, a second pixel 210-2, and so until a Nth pixel 210-N, wherein "N" corresponds to the total number of pixels included in the plurality of pixels 210). As discussed previously the plurality of pixels 210 are segmented to form pixel cells included in the plurality of pixel cells 205 (e.g., a first pixel cell 205-1 as illustrated, which may be representative of any other pixel cell included in the plurality of pixel cells 205). It is appreciated that in some embodiments, the total number of color filters (e.g., "M") included in the plurality of color filters 206 may be equal to the total number of photodiodes (e.g., "N") included in the plurality of photodiodes 204 (e.g., a one-to-one ratio of color filters to photodiodes). However, in other embodiments the plurality of color filters 206 may be shared by adjacent photodiodes included in the plurality of photodiodes 204 such that "M" is less than "N." For example, in some embodiments each pixel cell included in the plurality of pixel cells 205 may include multiple pixels included in the plurality of pixels 210. In some embodiments, pixels included in the plurality of pixels 210 for a common pixel cell included in the plurality of pixel cells 205 (e.g., the first pixel 210-1 and the second pixel 210-2 are included in the first pixel cell 205-1) may share the same color filter or otherwise have a common color filter configuration (e.g., the first color filter 206-1 and the second color filter 206-2 may have a common spectral photoresponse).

As illustrated, the plurality of color filters 206 are optically disposed between the plurality of microlenses 208 and the plurality of photodiodes 204 such that light 298 propagates through both the plurality of microlenses and the plurality of color filters 206 before reaching the plurality of photodiodes 204 (i.e., when the imaging system 200 is a backside illuminated image sensor). Each microlens included in the plurality of microlenses 208 is configured to direct or otherwise focus the light 298 through an underlying color filter included in the plurality of color filters 206 towards a respective one of the plurality of photodiodes 204. The plurality of color filters 206 filter or otherwise attenuate the light 298 focused by the plurality of microlenses 208. In some embodiments, the plurality of color filters 206 may include one or more red, green, blue, infrared, clear, transparent, cyan, magenta, yellow, black, or any other color filter to filter visible or non-visible light (e.g., the light 298). Similar to the plurality of color filters 206, the total number of microlenses included in the plurality of microlenses 208 may be equal to the total number of photodiodes (e.g., "N") included in the plurality of photodiodes 204 (e.g., a one-to-one ratio of microlenses to photodiodes) and/or the total number of color filters (e.g., "M") included in the plurality of color filters 206 (e.g., a one-to-one ratio of microlenses to color filters). However, in other embodiments the plurality of microlenses 208 may be shared by adjacent photodiodes included in the plurality of photodiodes 204 (e.g., a group of adjacent photodiodes included in the plurality of photodiodes 204, such as the first photodiode 204-1, the second photodiode 204-2, and/or other photodiodes adjacent to the first photodiode 204-1 and the second photodiode 204-2, may be optically aligned with or otherwise share an individual microlens included in the plurality of microlenses 208).

As illustrated in FIG. 2B, circuitry 254 is disposed in or on the second semiconductor substrate 251 and circuitry 294 is disposed in or on the optional third semiconductor substrate 291. In some embodiments, the circuitry 254 includes the pixel cell circuitry 255 and the periphery circuitry 256 illustrated in FIG. 2A (e.g., pixel transistors such as reset transistors, source-follower transistors, row select transistors, and so on, analog to digital circuitry, signal processing circuitry, and other circuitry to facilitate imaging an external scene). In the same or other embodiments, certain circuitry elements may be offloaded to the optional third semiconductor substrate 291 (e.g., analog to digital circuitry, signal processing circuitry, and other circuitry to facilitate imaging). It is appreciated that in some embodiments, certain circuitry elements may also be present in or on the first semiconductor substrate 201 that are not illustrated in FIG. 2A (e.g., one or more transfer gates, floating diffusion regions, and the like as illustrated in FIGS. 2C-2J).

Figure 2C:
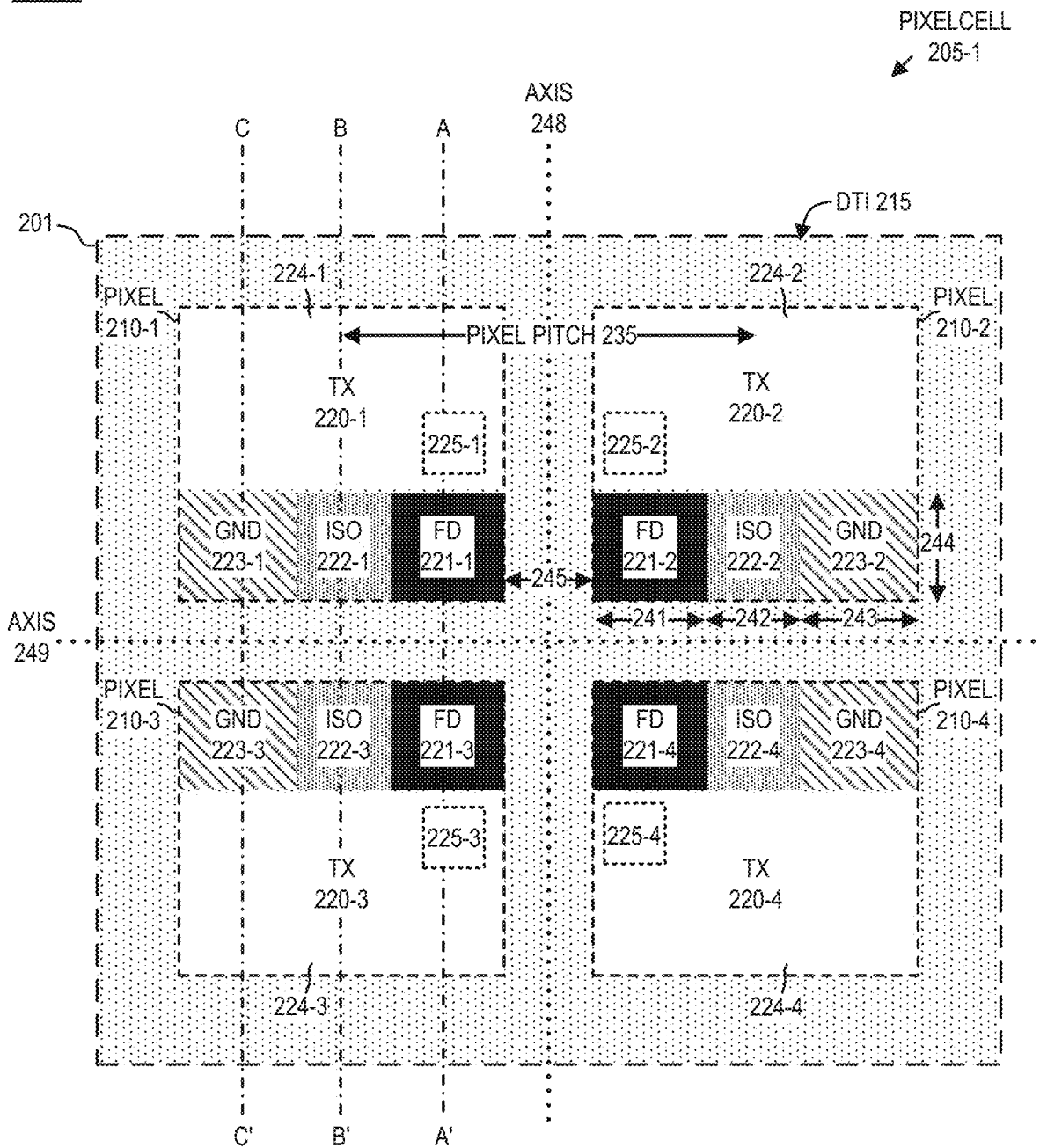
FIG. 2C illustrates a top view of a first semiconductor substrate included in the example imaging system of FIG. 2A, in accordance with embodiments of the present disclosure.

FIG. 2C illustrates a top view 201-TV of the first semiconductor substrate 201 included in the example imaging system 200 of FIG. 2A, in accordance with embodiments of the present disclosure. More specifically, the top view 201-TV is a schematic representative of a planar view extending through the metallization layer 230 illustrated in FIG. 2B looking towards the first semiconductor substrate 201. It is appreciated that certain elements may be omitted (e.g., the intermetal dielectric layers 232) or otherwise be obstructed from view (e.g., the plurality of color filters 206, the plurality of microlenses 208) to avoid obscuring certain aspects of the disclosure.

Referring back to FIG. 2C, the top view 201-TV shows the first pixel cell 205-1 included in the plurality of pixel cells 205. In some embodiments, the first pixel cell 205-1 is representative of any other pixel cell included in the plurality of pixel cells 205 (i.e., other pixel cells included in the plurality of pixel cells 205 may correspond to different instances of the first pixel cell 205-1). The first pixel cell 205-1 includes a two-by-two group of pixels included in the plurality of pixels 210 (e.g., the first pixel 210-1, the second pixel 210-2, a third pixel 210-3, and a fourth pixel 210-4) disposed within the first semiconductor substrate 201. As illustrated individual pixels included in the plurality of pixels 210 are separated from one another by a deep trench isolation (DTI) structure 215. Similarly, individual pixel cells included in the plurality of pixel cells 205 are separated from one another by the DTI structure 215 (not illustrated). The top view 201-TV further shows a plurality of transfer gates (TX) 220 (e.g., a first transfer gate 220-1 of the first pixel 210-1, a second transfer gate 220-2 of the second pixel 210-2, a third transfer gate 220-3 of the third pixel 210-3, and a fourth transfer gate 220-4 of the fourth pixel 210-4), a plurality of floating diffusion regions (FD) 221 (e.g., a first floating diffusion region 221-1 of the first pixel 210-1, a second floating diffusion region 221-2 of the second pixel 210-2, a third floating diffusion region 221-3 of the third pixel 210-3, and a fourth floating diffusion region 221-4 of the fourth pixel 210-4), a plurality of isolation regions (ISO) 222 (e.g., a first isolation region 222-1 of the first pixel 210-1, a second isolation region 222-2 of the second pixel 210-2, a third isolation region 222-3 of the third pixel 210-3, and a fourth isolation region 222-4 of the fourth pixel 210-4), and a plurality of ground contact regions (GND) 223 (e.g., a first ground contact region 223-1 of the first pixel 210-1, a second ground contact region 223-2 of the second pixel 210-2, a third ground contact region 223-3 of the third pixel 210-3, and a fourth ground contact region 223-4 of the fourth pixel 210-4), which are constituent components of the plurality of pixels 210 included in the first pixel cell 205-1. It is further appreciated, that each one of the plurality of pixels 210 also includes a corresponding photodiode (see, e.g., FIGS. 2D-2F) covered in the illustrated view of FIG. 2C, by an associated transfer gate included in the plurality of transfer gates 220 (e.g., the first pixel 210-1 includes a photodiode covered by or otherwise optically aligned with the first transfer gate 220-1 when viewed towards the first side of the first semiconductor substrate 201). Accordingly, the first pixel 210-1, the second pixel 210-2, the third pixel 210-3, and the fourth pixel 210-4 each include respective instances of a photodiode (e.g., the plurality of photodiodes 204 illustrated in FIG. 2B), a transfer gate (e.g., the plurality of transfer gates 220 illustrated in FIG. 2C), a ground contact region (e.g., the plurality of ground contact regions 223 illustrated in FIG. 2C), a floating diffusion region (e.g., the plurality of floating diffusion regions 221 illustrated in FIG. 2C), and an isolation region (e.g., the plurality of isolation regions 222 illustrated in FIG. 2C) between the ground contact region and the floating diffusion region. It is appreciated that for a given pixel (e.g., any of the first pixel 210-1, the second pixel 210-2, the third pixel 210-3, or the fourth pixel 210-4) included in the pixel cell 205-1, the isolation region 222 provides physical separation (i.e., isolation) of the floating diffusion region 221 and the ground contact region 223 (e.g., the first isolation region 222-1 physically separates the first floating diffusion region 221-1 from the first ground contact region 223-1 of the first pixel 210-1).

It is appreciated that respective elements of the plurality of transfer gates 220, the plurality of floating diffusion regions 221, the plurality of isolation regions 222, and the plurality of ground contact regions 223 are each disposed within or on the first semiconductor substrate 201 and arranged within each pixel included in the plurality of pixel cells 210 in a specific manner to enable reduced pixel pitch and mitigate performance variance due to process variation during fabrication. For example, the first floating diffusion region 221-1, the first isolation region 222-1, and the first ground contact region 223-1 are disposed proximate to the first transfer gate 220-1 of the first pixel 205-1. Specifically, the first floating diffusion region 221-1, the first isolation region 222-1, and the first ground contact region 223-1 are aligned with a common edge of the first transfer gate 220-1. Additionally, the first isolation region 222-1 is disposed between the first ground contact region 223-1 and the first floating diffusion region 221-1. It is appreciated that a similar arrangement of elements that is mirrored (i.e., reflected) about an axis (e.g., axis 249 and 248 with respect to the first pixel 210-1) also applies to other pixels included in the plurality of pixels 210 as illustrated in FIG. 2C (e.g., the second isolation region 222-2 is disposed between the second floating diffusion region 221-2 and the second ground contact region 223-2, and so on). As illustrated, the plurality of isolation regions 222 are positioned to isolate the plurality of floating diffusion regions 221 from the plurality of ground contact regions 223 (e.g., the first isolation region 222-1 is positioned between the first floating diffusion region 221-1 and the first ground contact region 223-1 to physically and electrically separate the first floating diffusion region 221-1 from directly contacting the first ground contact region 223-1). In some embodiments, the plurality of isolation regions 222 may be individually or collectively coupled to a ground or reference voltage.

Figure 2D:
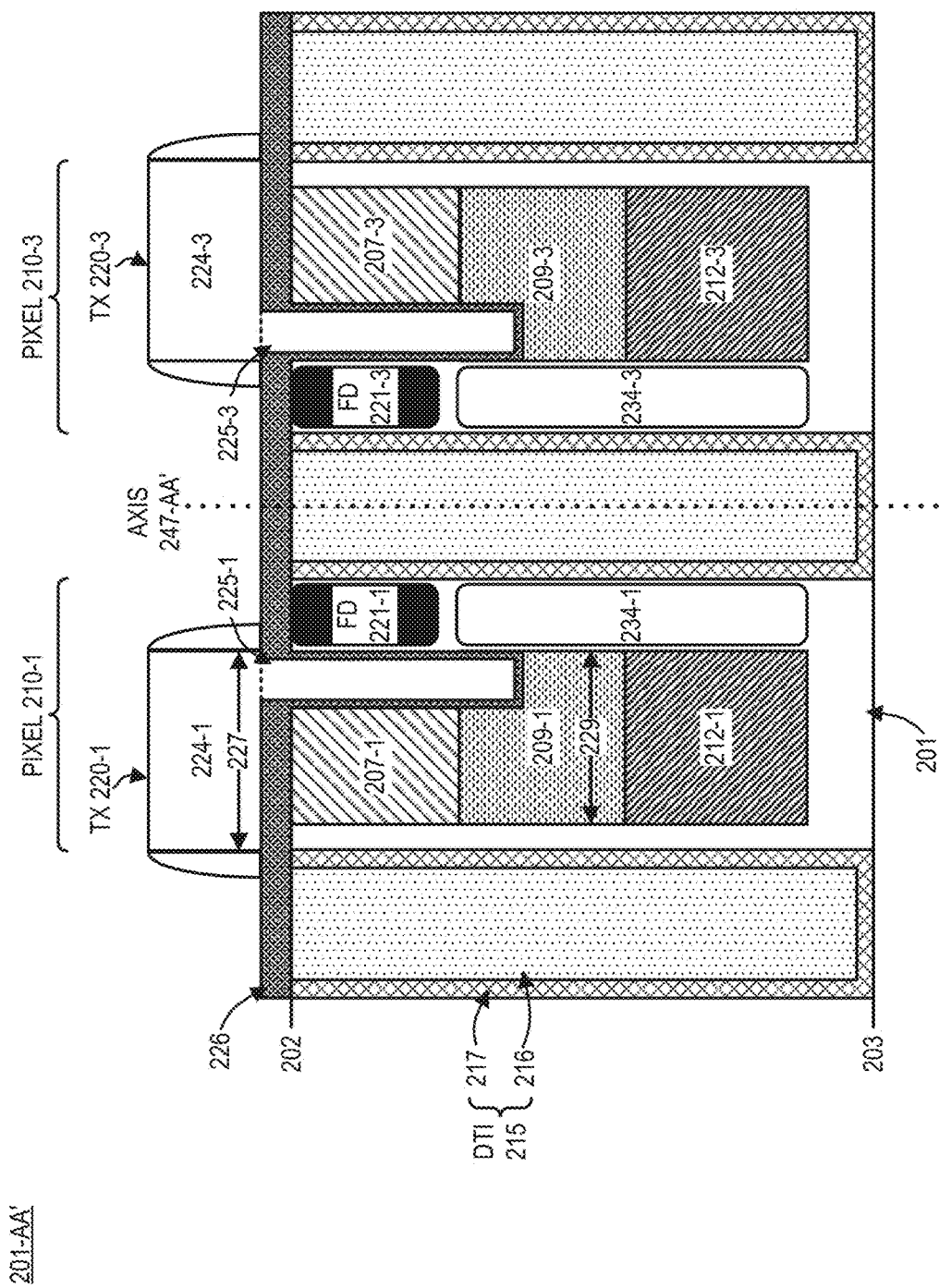
FIG. 2D illustrates a cross-sectional view of the first semiconductor substrate along line A-A' shown in FIG. 2C, in accordance with embodiments of the present disclosure.

It is further appreciated that the plurality of transfer gates 220 each include one of planar regions 224 (e.g., first planar region 224-1, second planar region 224-2, third planar region 224-3, fourth planar region 224-4, or so on) and one of vertical regions 225 (e.g., first vertical region 225-1, second vertical region 225-2, third vertical region 225-3, fourth vertical region 225-4, or so on) to collectively form an individual one of the plurality of transfer gates 220. As illustrated in FIG. 2C and FIG. 2D, the vertical regions 225 extend from a respective one of the planar regions 224 into the first semiconductor substrate 201 (e.g., first vertical region 225-1 extends from first planar region 224-1 to form the first transfer gate 220-1). In the illustrated embodiment of FIG. 2C, the vertical regions 225 may not be viewable from the top view 210-TV. However, to facilitate discussion of the illustrated embodiment, a dashed line is shown to represent the position of the vertical regions 225 that extend into the first semiconductor substrate 201 from the planar regions 224 (e.g., as illustrated in FIG. 2D). As illustrated, the vertical regions 225 are each disposed proximate to a corresponding one of the plurality of floating diffusion regions 221 of the first pixel cell 205-1 for charge transfer efficiency consideration. In some embodiments, the plurality of isolation regions 222 may each be formed of doped regions having an opposite conductivity type to an adjacent photodiode and floating diffusion region included in the plurality of floating diffusion regions 221. Additionally, each element has a pre-determined lateral area, within manufacturing tolerances appropriate for the utilized fabrication technology node. In some embodiments, the pre-determined lateral area of each of the plurality of floating diffusion regions 221, the plurality of isolation regions 222, and the plurality of ground contact regions 223 are substantially equivalent (e.g., within 10% or less). In other embodiments, the pre-determined lateral areas of each of the plurality of floating diffusion regions 221, plurality of isolation regions 222, and the plurality of ground contact regions 223 are different. In the illustrated embodiment, the second floating diffusion region 221-2 has a lateral area based on length 241 and width 244, which is equivalent to a lateral area of the second isolation region 222-2 based on length 242 and the width 244 and a lateral area of the second ground contact region 223-2 based on length 243 and the width 244. In some embodiments, each of the lengths 241, 242, and 243 may be less than or equal to 0.3 µm, less than or equal to 0.2 µm, less than or equal to 0.1 µm, or otherwise. In the same or other embodiments, the width 244 may be less than or equal to 0.3 µm, less than or equal to 0.2 µm, less than or equal to 0.1 µm, or otherwise. In the same or other embodiments, each of the lengths 241, 242, and 243 and the width 244 may have a minimum length in accordance with the design rules of a manufacturing node being used for fabrication. Accordingly, in some embodiments, a length of an individual one of the plurality of transfer gates (e.g., the second transfer gate 220-2) corresponds to the summation of the lengths 241, 242, and 243. In other words, the length of the second transfer gate 220-2, or any other transfer gate included in the plurality of transfer gates 220, may be approximately (e.g., within 10%) three times that of any one of the lengths 241, 242, or 243. Similarly, in one or more embodiments, a width of an individual one of the plurality of transfer gates 220 (e.g., the second transfer gate 220-2) may be approximately (e.g., within 10%) three times that of the width 244. In the same or other embodiments, the separation distance between adjacent pixels (e.g., separation distance 245 between the first pixel 210-1 and the second pixel 210-2) provided by the DTI structure 215 may be substantially equivalent (e.g., within 10%) to any one of, or a combination of, the lengths 241, 242, and 243. Additionally, the center of each of the plurality of pixels 210 are separated from an adjacent one of the plurality of pixels 210 by a pitch pixel, which may be uniform throughout the plurality of pixels 210 (e.g., the distance between the center of the first pixel 210-1 and an adjacent pixel such as the second pixel 210-2 corresponds to pixel pitch 235, which may be the same for each pair of adjacent pixels included in the plurality of pixels 210). In some embodiments, the pixel pitch 235 is less than or equal to 1 µm, less than or equal to 0.7 µm, less than or equal to 0.5 µm, less than or equal to 0.4 µm, or otherwise. In the same or other embodiments, the pixel pitch 235 may have a minimum pitch in accordance with the design rules of a manufacturing node being used for fabrication.

In the illustrated embodiment of FIG. 2C, the first pixel 210-1, the second pixel 210-2, the third pixel 210-3, and the fourth pixel 210-4 collectively form a pixel cell of the imaging system 200, which may correspond to a minimal repeating unit of the plurality of pixel cells 205. In the same or other embodiment, a pixel cell may correspond to a group of pixels sharing one or more elements (e.g., color filter and/or microlens), but not necessarily correspond to a minimal repeating unit of the plurality of pixel cells 205. For example, in some embodiments a group of pixel cells may form a minimal repeating unit of the plurality of pixel cells 205. As illustrated in FIG. 2C, each pixel 210 included in the plurality of pixel cells 205 includes a corresponding one of the plurality of transfer gates 220, the plurality of floating diffusion regions 221, the plurality of isolation regions 222, and the plurality of ground contact regions 223 that are collectively and laterally surrounded by the DTI structure 215. In other words, the DTI structure 215 physically separates and electrically isolates adjacent pixels included in the plurality of pixels 210 from one another (e.g., the first pixel 210-1 is separated and isolated from the second pixel 210-2 and the third pixel 210-3 by the DTI structure 215). In the illustrated embodiment, the DTI structure 215 is a contiguous element that extends continuously from the first side of the first semiconductor substrate 201 to the second side of the first semiconductor substrate (see, e.g., DTI 215 illustrated in FIGS. 2D-2F) to provide, for example, physical separation of the first pixel 210-1 from adjacent pixels included in the plurality of pixels 210 (e.g., the second pixel 210-1 and the third pixel 210-3).

The plurality of pixels 210 is arranged in rows and columns to form a pixel array representative of the plurality of pixel cells 205. In the illustrated embodiment, the first pixel 210-1, the second pixel 210-2, the third pixel 210-3, and the fourth pixel 210-4 are arranged in the rows and the columns to collectively form a two-by-two pixel array corresponding to the first pixel cell 205-1. For example, the first pixel 210-1 and the second pixel 210-2 are in a first row included in the rows while the third pixel 210-3 and the fourth pixel 210-4 are in a second row included in the rows. Similarly, the first pixel 210-1 and the third pixel 210-3 are in a first column included in the columns and the second pixel 210-2 and the fourth pixel 210-4 are in a second column included in the columns. It is further appreciated that the first pixel 210-1 is adjacent to the second pixel 210-2 and the third pixel 210-3 such that there are no intervening pixels disposed between the first 210-1 and the second pixel 210-2 or the first pixel 210-1 and the third pixel 210-3. As illustrated, first pixel cell 205-1 is mirror symmetric about axis 248 and axis 249. In other words, elements of the first pixel cell 205-1 are arranged such that there is reflective symmetry about the axis 248 and the axis 249. It is further noted that in the illustrated embodiment, the axis 248 is orthogonal to the axis 249. It is appreciated that the mirror symmetry facilitates coupling elements included in adjacent pixels for a given pixel cell and/or adjacent pixel cells (see, e.g., FIG. 2J in which the floating diffusion regions for a given pixel cell are coupled to one another and subsequently coupled to one of the individual groups of components of the pixel cell circuitry). However, in other embodiments, axis 248 and axis 249 may not be orthogonal to one another, or there may be additional or different axes about which the pixel cell is mirror symmetric.

Referring back to FIG. 2C, it is appreciated respective floating diffusion regions of adjacent pixel (e.g., the first pixel 210-1, the second pixel 210-2, the third pixel 210-3, and the fourth pixel 210-4) included in a given pixel cell (e.g., the first pixel cell 205-1) are separated from one another such that the DTI structure 215 is disposed between adjacent floating diffusion regions included in the plurality of floating diffusion regions 221 without other intervening elements. In other words, adjacent floating diffusion regions abut the DTI structure 215. For example, the DTI structure 215 is disposed between the first floating diffusion region 221-1 and the second floating diffusion region 221-2 without any intervening elements such that the first floating diffusion region 221-1 and the second floating diffusion region 221-2 abut opposite sides of the DTI structure 215. Similarly, the DTI structure 215 is disposed between first floating diffusion region 221-1 and the third floating diffusion region 221-3 without any intervening elements such that the first floating diffusion region 221-1 and the third floating diffusion region 221-3 abut opposite sides of the DTI structure 215. It is appreciated that the illustrated configuration is advantageous when coupling the plurality of floating diffusion regions 221 of a given pixel cell together (e.g., as illustrated in FIG. 3G, which shows a simplified layout when interconnecting floating diffusion regions of a given pixel cell). It is further appreciated that the number of pixels included in the plurality of pixels 210 for a given pixel cell may include more or less pixels (e.g., instead of the two-by-two pixel configuration for the illustrated pixel cell of FIG. 2C, there may be a two-by-four, two-by-eight, four-by-four, or other configurations which incorporate more or less pixels within a given pixel cell).

FIG. 2D illustrates a cross-sectional view 210-AA' of the first semiconductor substrate 201 along the line A-A' shown in FIG. 2C, in accordance with embodiments of the present disclosure. The cross-sectional view 201-AA' includes a first pinning region 207-1, a third pinning region 207-3, a first doped region 209-1, a third doped region 209-3, a first deep doped region 212-1, a third deep doped region 212-3, the DTI structure 215 including an inner region 216, and an outer region 217, the first floating diffusion region 221-1, the third floating diffusion region 221-3, a first well 234-1, and a third well 234-3, each disposed between the first side 202 and the second side 203 of the first semiconductor substrate 201. A gate oxide (e.g., an oxide layer 226) is disposed proximate to the first side 202 of the first semiconductor substrate 201. The cross-sectional view 201-AA' further includes the first transfer gate 220-1 including a first planar region 224-1 and a first vertical region 225-1, the third transfer gate 220-3 including a third planar region 224-3 and a third vertical region 225-3, and an axis 247-AA'. It is appreciated that elements are hyphenated with a "1" or a "3" to indicate respective association with the first pixel 210-1 or the third pixel 210-3. For example, the first pinning region 207-1, the first doped region 209-1, the first deep doped region 212-1, the first transfer gate 220-1 including the first planar region 224-1 and the first vertical region 225-1, the first floating diffusion region 221-1, and the first well 234-1 are all included in the first pixel 210-1.

As illustrated the DTI structure 215 extends an isolation depth into the first semiconductor substrate 201 from the first side 202 towards the second side 203 of the first semiconductor substrate 201. The DTI structure 215 separates the first pixel 210-1 from the third pixel 210-3, which is adjacent to the first pixel 210-1. In some embodiments, the isolation depth of the DTI structure 215 may be greater than 1 µm but less than or equal to a substrate thickness (e.g., 2.5 µm to 7 µm) of the first semiconductor substrate 201. In the same or other embodiments, there may exist at least a 1 µm thick region of the first semiconductor substrate 201 disposed between the second side 203 of the first semiconductor substrate 201 and the DTI structure 215. As discussed previously, the DTI structure 215 provides both physical separation and electrical isolation for adjacent pixels included in the plurality of pixels 210. The DTI structure 215 may also provide optical isolation between first pixel 210-1 and the third pixel 210-3. In some embodiments, the DTI structure 215 is a monolithic structure with a uniform composition (e.g., an oxide material such as silicon dioxide, a dielectric material having refractive index lower than the first semiconductor substrate 201, or a different insulating material). In the illustrated embodiment, the DTI structure 215 includes the inner region 216 (e.g., formed of polycrystalline silicon, a metal such as tungsten or aluminum, an insulating material with a refractive index lower than a corresponding refractive index of the first semiconductor substrate 201, or an oxide material such as silicon dioxide) that is surrounded by the outer region 217 (e.g., an insulating material such as silicon dioxide, or high k material such as aluminum oxide, hafnium oxide, tantalum oxide, zirconium oxide, or other material). It is appreciated that in some embodiments the DTI structure 215 may correspond to an attenuation layer that may reflect, absorb, diffract, or otherwise impede electrical and/or optical crosstalk between adjacent pixels included in the plurality of pixels 210.

In the illustrated embodiment, the first pixel 210-1 and the third pixel 210-3 each include a respective photodiode included in a plurality of photodiodes 204 (see, e.g., FIG. 2B). For example, the first pinning region 207-1, the first doped region 209-1, and the first deep doped region 212-1 in combination with the first semiconductor substrate 201 collectively form a pinned photodiode corresponding to the first photodiode 204-1 of the first pixel 210-1 illustrated in FIG. 2B, which may be representative of any or each other photodiode included in the plurality of photodiodes 204. In some embodiments, each of the first pinning region 207-1 and the third pinning region 207-3 may be coupled to a ground. Referring back to FIG. 2D, it is appreciated that the first pinning region 207-1 and the first deep doped region 212-1 may be optional elements (e.g., in an embodiment where the first photodiode 204-1 of FIG. 2B is not a pinned photodiode). As illustrated, the first pinning region 207-1 and the third pinning region 207-3 are each disposed proximate to the first side 202 of the first semiconductor substrate 201 to provide surface passivation for the underlying photodiodes. In the illustrated embodiment, the first pinning region 207-1 is disposed between the first side 202 of the first semiconductor substrate 201 and the first doped region 209-1 and the third pinning region 207-3 is disposed between the first side 202 of the first semiconductor substrate 201 and the third doped region 209-3. In some embodiments, the first doped region 209-1, the third doped region 209-3, the first deep doped region 212-1, and the third deep doped region 212-3 are each a first conductivity type (e.g., N-type or P-type electrical conductivity) while the first semiconductor substrate 201, the first pinning region 207-1, and the third pinning region 207-3 are each a second conductivity type (e.g., P-type or N-type electrical conductivity) opposite of the first conductivity type. It is appreciated that in some embodiments a first doping concentration of the doped regions (e.g., the first doped region 209-1 and/or the third doped region 209-3) is different than a second doping concentration of the deep doped regions (e.g., the first deep doped region 212-1 and/or the third deep doped region 212-1). In some embodiments, the doping concentration of the first pinning region 207-1 or the third pinning region 207-3 is configured to be greater than the doping concentration of the first semiconductor substrate 201.

As illustrated in FIG. 2D, the first transfer gate 220-1, the third transfer gate 220-3, the first floating diffusion region 221-1, and the third floating diffusion region 221-3 are each disposed proximate to the first side 202 of the first semiconductor substrate 201. Each of the plurality of transfer gates 220 include a respective planar region electrically coupled to a vertical region (e.g., the first transfer gate 220-1 includes the first planar region 224-1 coupled to the first vertical region 225-1 and the third transfer gate 220-3 includes the third planar region 224-3 coupled to the third vertical region 225-3). For example, the first vertical region 225-1 extends from the first planar region 224-1 of the first transfer gate 220-1 into the first semiconductor substrate 201 towards the second side 203 of the first semiconductor substrate 201. Disposed between the plurality of transfer gates 220 and the plurality of photodiodes (e.g., the plurality of pinning regions 207, the plurality of doped regions 209, and the plurality of deep doped regions 212) is the oxide layer 226, which provides an insulating barrier (e.g., to form a plurality of transfer transistors). In some embodiments the oxide layer 226 is silicon dioxide, hafnium oxide, aluminum oxide, or any other insulating material with suitable properties for forming the plurality of transfer transistors.

It is appreciated that the first side 202 of the first semiconductor substrate 201 is disposed between the first planar region 224-1 and the underlying photodiode of the first pixel 210-1 (e.g., the first doped region 209-1 as well as the first pinning region 207-1 and the first deep doped region 212-1). Additionally, the first vertical region 225-1 of the first transfer gate 220-1 is disposed between the first pinning region 207-1 and the first floating diffusion region 221-1 of the first pixel 210-1. The first vertical region 225-1 of the first transfer gate 220-1 is also partially disposed between the first doped region 209-1 and the first well 234-1. In the illustrated embodiment, the first vertical region 225-1 of the first transfer gate 220-1 is also disposed between the first planar region 224-1 of the first transfer gate 220-1 and the first doped region 209-1. Additionally, the first vertical region 225-1 is disposed between the first doped region 209-1 and the first floating diffusion region 221-1 of the first pixel 210-1. The first well 234-1 and third well 234-3 are disposed between an adjacent photodiode (e.g., the first doped region 209-1 and the first deep doped region 212-1 of the first pixel 210-1 or the third doped region 209-3 and the third deep doped region 212-3 of the third pixel 210-3) and the DTI structure 215 (i.e., a portion of the DTI structure 215 that is disposed between first pixel 210-1 and first pixel 210-3). In some embodiments, the first floating diffusion region 221-1 of the first pixel 210-1 is disposed in the first well 234-1 and the third floating diffusion region 221-3 is disposed in the third well 234-3. In some embodiments, the first well 234-1 corresponds to a doped well region having an opposite conductivity type relative to a conductivity type of the first doped region 209-1, the first deep doped region 212-1, and/or the first floating diffusion region 221-1 of the first pixel 210-1. In the same or other embodiments, the third well 234-3 corresponds to a doped well region having an opposite conductivity type relative to a conductivity type of the third doped region 209-3, the third deep doped region 212-3, and/or the third floating diffusion region 221-3 of the third pixel 210-3.

To facilitate reduced pixel pitch and mitigating performance variance due to processing variation, the structure of the plurality of pixels 210 is further configured such that the planar region (e.g., the first planar region 224-1 and the third planar region 224-3) laterally extends over the underlying photodiode (e.g., any one or more of the first pinning region 207-1, the first doped region 209-1, and/or the first deep doped region 212-1 for the first pixel 210-1) to protect the underlying photodiode from contamination and/or damage during processing steps subsequent to the formation of the underlying photodiode (see, e.g., FIG. 3A-3G) on the first side 202 of the first semiconductor substrate 201. Accordingly, the transfer gate associated with the underlying photodiode (e.g., the first transfer gate 220-1 in the case of the first pixel 210-1) is optically aligned with the underlying photodiode (e.g., any one or more of the first pinning region 207-1, the first doped region 209-1, and/or the first deep doped region 212-1 for the first pixel 210-1) such that the planar region (e.g., the first planar region 224-1 for the first pixel 210-1) of the transfer gate laterally extends over the underlying photodiode to cover an entirety of a lateral area of the underlying photodiode when the first semiconductor substrate 201 is viewed from the first side 202 (e.g., as shown in FIG. 2C, the underlying photodiodes do not extend beyond the lateral area covered by the plurality of transfer gates 220 and thus are not visible in the top view 201-TV). In some embodiments, the lateral area of the underlying photodiode is less than or equal to a lateral area of the planar region of the transfer gate. For example, in one embodiment, a lateral area of the first doped region 209-1 is less than or equal to a lateral area of the first planar region 224-1 of the first transfer gate 220-1. In the illustrated embodiment, the lateral area of the first doped region 209-1 is based on a width 229 of the first doped region 209-1 and a length of the first doped region 209-1 (e.g., corresponding to the combination of the lengths 241, 242, and 243 illustrated in FIG. 2C) while the lateral area of the first planar region 224-1 of the first transfer gate is based on a width 227 of the first planar region 224-1 and a length of the first planar region 224-1 (e.g., corresponding to the combination of the lengths 241, 242, and 243 illustrated in FIG. 2C). Thus, in some embodiments the width 229 of the first doped region 209-1 is less than or equal to the width 227 of the first planar region 224-1 of the first transfer gate 220-1. In the same or other embodiments, the length of the first doped region 209-1 is less than or equal to the length of the first planar region 224-1 of the first transfer gate 220-1. Consequently, the first planar region 224-1 of the first transfer gate 220-1 extends over the first doped region 209-1 to cover an entirety of the lateral area of the first doped region 209-1 when the first semiconductor substrate 201 is viewed from the first side 202. It is further appreciated that the first pixel 210-1 is mirror symmetric to the third pixel 210-3 about the axis 247-AA'. In other words, in some embodiments there is reflective symmetry through the first semiconductor substrate 201 about the axis 247-AA', which is orthogonal to both the axis 248 and the axis 249 illustrated in FIG. 2C.

Figure 2E:
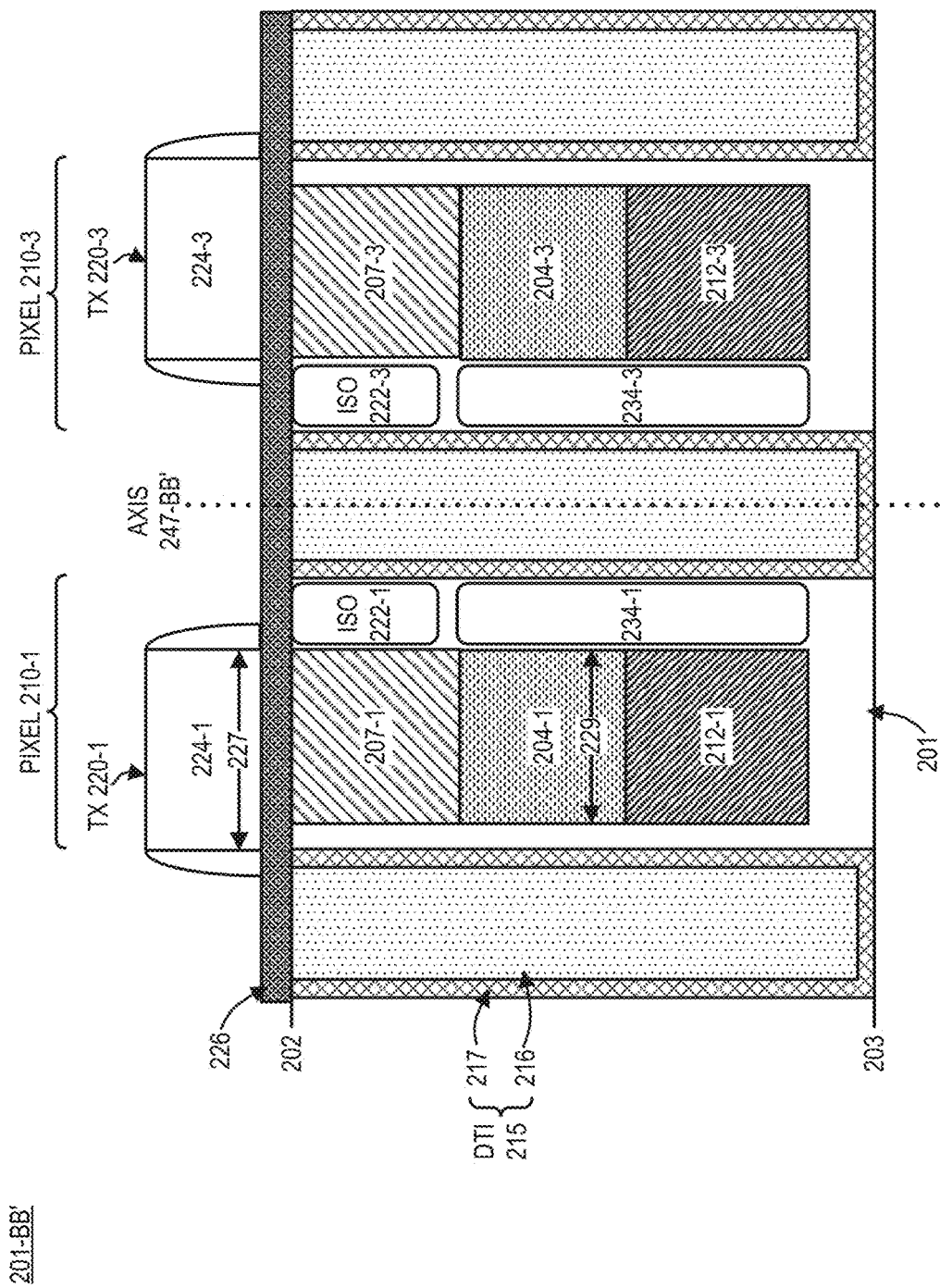
FIG. 2E illustrates a cross-sectional view of the first semiconductor substrate along line B-B' shown in FIG. 2C, in accordance with embodiments of the present disclosure.

FIG. 2E illustrates a cross-sectional view 201-BB' of the first semiconductor substrate 201 along the line B-B' shown in FIG. 2C, in accordance with embodiments of the present disclosure. The cross-sectional view 201-BB' is similar in many regards to the cross-sectional view 201-AA' illustrated in FIG. 2D and includes the same or similar features. One difference is the line B-B' shown in FIG. 2C extends through the first isolation region 222-1 and the third isolation region 222-3. Accordingly, the cross-sectional view 201-BB' illustrated in FIG. 2E shows the first isolation region 222-1 and the third isolation region 222-3 disposed within the first semiconductor substrate 201 proximate to the first side 202 and between the first side 202 and the second side 203. In some embodiments, the first isolation region 222-1 and the third isolation region 222-3 correspond to shallow isolation well regions where portions of the first semiconductor substrate 201 have been doped to have the second conductivity type (e.g., P-type when the first doped region 204-1 is N-type). In the same or other embodiments, the first well 234-1 disposed proximate to the first isolation region 222-1 also corresponds to a doped region of the first semiconductor substrate 201 that has been doped to have the second conductivity type. In the same or other embodiments, the first well 234-1 and the third well 234-3 correspond to deep isolation well regions. Dopants forming the first well 234-1 may be implanted into the first semiconductor substrate 201 at a depth greater depth than the first isolation region 222-1, for example with greater implantation energy and/or with multiple implantation steps with varying implantation energy, in manner that the first well 234-1 abuts and extends from the first isolation region 222-1 toward the second side 203 of the first semiconductor substrate 201. In other words, the first isolation region 222-1 and the first well 234-1 may be electrically coupled and structurally connected (e.g., via diffusion). In some embodiments, each of the first isolation region 222-1, the third isolation region 222-3, the first well 234-1, and the third well 234-3 may have a dopant concentration greater than a dopant concentration of the first semiconductor substrate 201.

It is appreciated that the first isolation region 222-1 may be representative of any other isolation regions included in the plurality of isolation regions 222 (e.g., the third isolation region 222-3) and include the same or similar features, in accordance with embodiments of the disclosure. It is further appreciated that the first pixel 210-1 is mirror symmetric to the third pixel 205-3 about the axis 247-BB'. In other words, in some embodiments there is reflective symmetry through the first semiconductor substrate 201 about the axis 247-BB', which is orthogonal to both the axis 248 and the axis 249 illustrated in FIG. 2C.

Figure 2F:
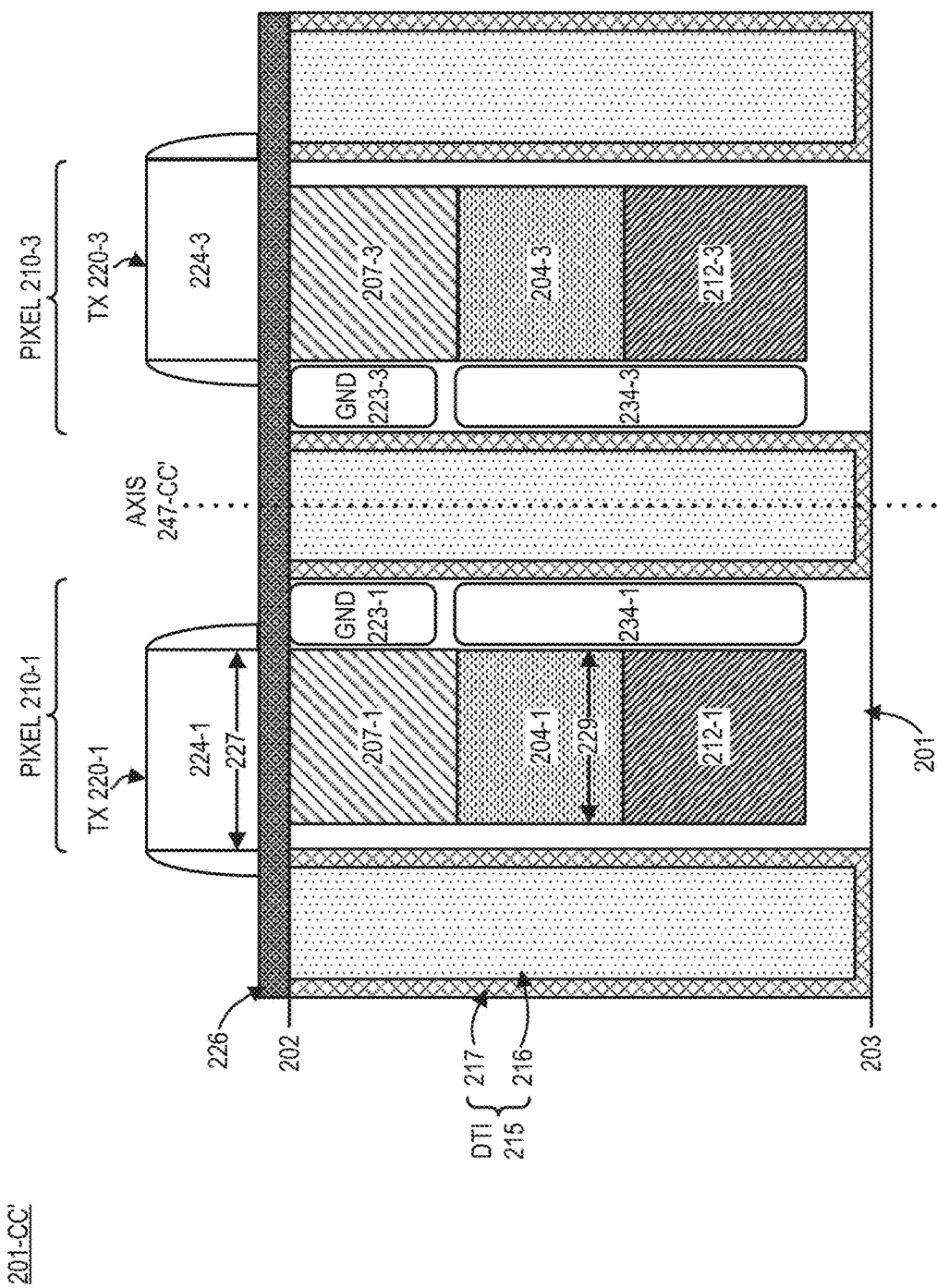
FIG. 2F illustrates a cross-sectional view of the first semiconductor substrate along line C-C' shown in FIG. 2C, in accordance with embodiments of the present disclosure.

FIG. 2F illustrates a cross-sectional view 201-CC' of the first semiconductor substrate 201 along line C-C' shown in FIG. 2C, in accordance with embodiments of the present disclosure. The cross-sectional view 201-CC' is similar in many regards to the cross-sectional view 210-AA' illustrated in FIG. 2D and includes the same or similar features. One difference is the line C-C' shown in FIG. 2C extends through the first ground contact region 223-1 and the third ground contact region 223-3. Accordingly, the cross-sectional view 210-CC' illustrated in FIG. 2F shows the first ground contact region 223-1 and the third ground contact region 223-3 disposed within the first semiconductor substrate 201 proximate to the first side 202 and between the first side 202 and the second side 203. In some embodiments, the first ground contact region 223-1 and the third ground contact region 222-3 correspond to heavily doped portions of the first semiconductor substrate 201 to have the second conductivity type (e.g., P-type when the first doped region 204-1 is N-type). It is appreciated that in some embodiments, a dopant concentration of the plurality of ground contact regions 223 (e.g., the first ground contact region 223-1 and the third ground contact region 223-3) is greater than a dopant concentration of the plurality of isolation regions 222 (e.g., the first isolation region 222-1 and the third isolation region 222-3 illustrated in FIG. 2E). In the same or other embodiments, the first well 234-1 disposed proximate to the first ground contact region 223-1 also corresponds to a doped region of the first semiconductor substrate 201 that has been doped to have the second conductivity type. In some embodiments, the first ground contact region 223-1 is a doped region (e.g., a heavily doped region) disposed in the first well 234-1 and the third ground contact region 222-3 is a doped region disposed in the third well 234-3. In some embodiments, a contact may be disposed in direct physical contact with the first ground contact region 223-1 to couple the first ground contact region 223-1 to a ground reference voltage via a metal interconnect structure (not illustrated). In some embodiments, the ground reference voltage may be located on the second semiconductor substrate 251 or the third semiconductor substrate 291 illustrated in FIG. 2B. Referring back to FIG. 2F, it is appreciated that the first ground contact region 223-1 may be representative of any other ground contact regions included in the plurality of ground contact regions 223 (e.g., the third ground contact region 222-3) and include the same or similar features, in accordance with embodiments of the disclosure. It is further appreciated that the first pixel 210-1 is mirror symmetric to the third pixel 210-3 about the axis 247-CC'. In other words, in some embodiments there is reflective symmetry through the first semiconductor substrate 201 about the axis 247-CC', which is orthogonal to both the axis 248 and the axis 249 illustrated in FIG. 2C.

Figure 2G:
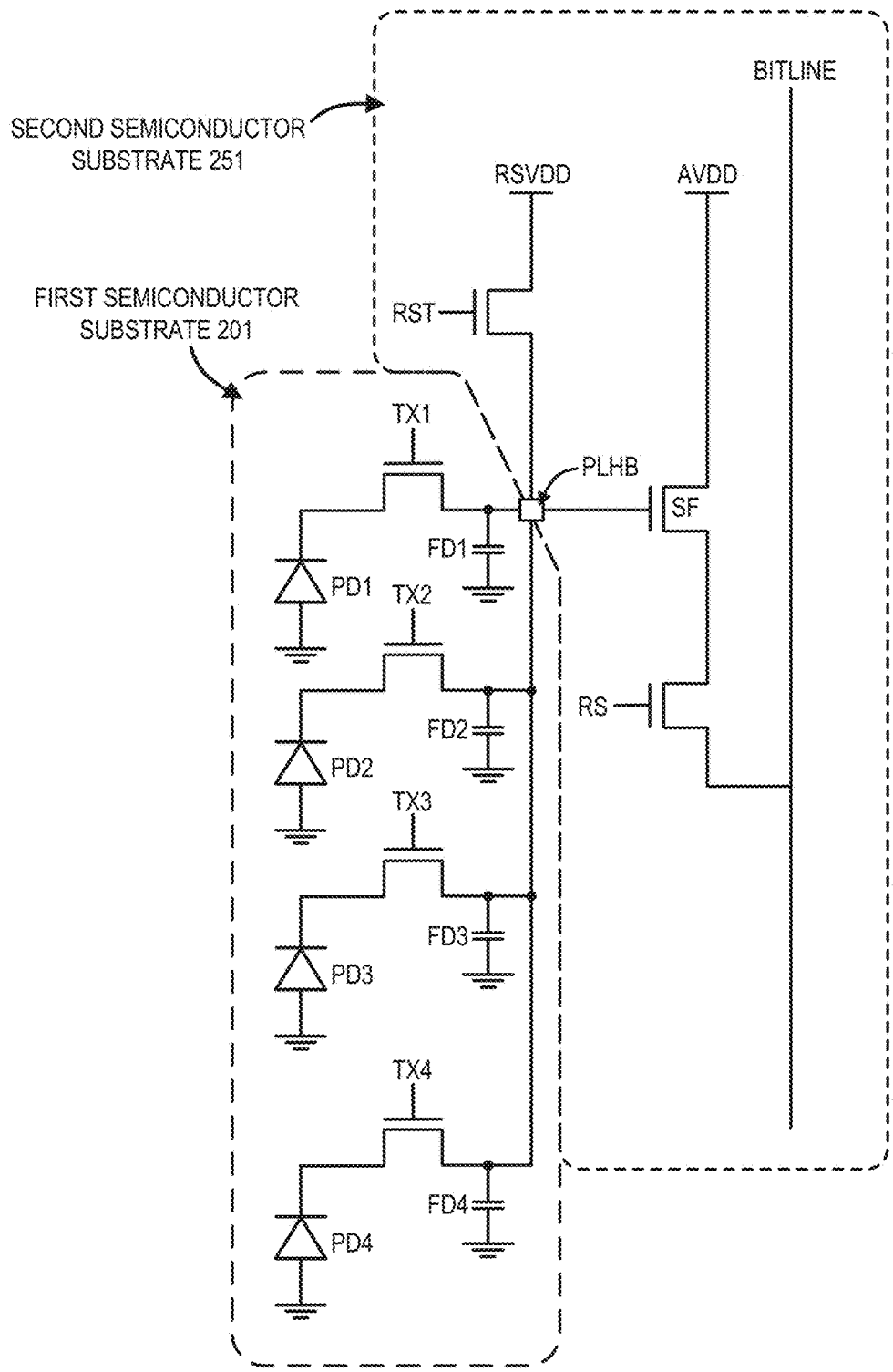
FIG. 2G is a schematic diagram of a pixel cell included in the example imaging system of FIG. 2A, in accordance with embodiments of the present disclosure.

FIG. 2G is a schematic diagram 299 of a pixel cell (e.g., the first pixel cell 205-1 illustrated in FIG. 2C) and pixel cell circuitry (e.g., a group of individual components included in the pixel cell circuitry for a given one of the plurality of pixel cells) included in the example imaging system 200 of FIG. 2A, in accordance with embodiments of the present disclosure. In particular, the schematic diagram 299 is one possible representation of the pixel cell illustrated in FIGS. 2C-2F (e.g., the first pixel cell 205-1). The schematic diagram 299 illustrates elements included in or on the first semiconductor substrate 201. Elements PD1, PD2, PD3, and PD4 correspond to respective photodiodes included in the plurality of photodiodes 204 illustrated in FIG. 2B (e.g., the first photodiode 204-1, the second photodiode 204-2, and so on) are respectively associated with the plurality of pixels 210 included in the pixel cell 205-1 illustrated in FIG. 2C (e.g., PD1 corresponds to the first photodiode 204-1 associated with the first pixel 210-1, PD2 corresponds to the second photodiode 204-2 associated with the second pixel 210-2, and so on). Elements TX1, TX2, TX3, and TX4 correspond to respective transfer gates included in the plurality of transfer gates 220 illustrated in FIG. 2C (e.g., the first transfer gate 220-1, the second transfer gate 220-2, and so on) are respectively associated with the plurality of pixels 210 of the first pixel cell 205-1 illustrated in FIG. 2C (e.g., TX1 corresponds to the first transfer gate 220-1 associated with the first pixel 210-1, TX2 corresponds to the second transfer gate 220-2 associated with the second pixel 210-2, and so on). Elements FD1, FD2, FD3, and FD4 correspond to respective floating diffusion regions included in the plurality of floating diffusion regions 221 illustrated in FIG. 2C (e.g., the first floating diffusion region 221-1, the second floating diffusion region 221-2, and so on) that are respectively associated with the plurality of pixels 210 included in the first pixel cell 205-1 illustrated in FIG. 2C (e.g., FD1 corresponds to the first floating diffusion region 221-1 associated with the first pixel 210-1, FD2 corresponds to the second floating diffusion region 221-2 associated with the second pixel 210-2, and so on). Additionally, each of the unlabeled grounds coupled to the plurality of floating diffusion regions (i.e., FD1, FD2, FD3, and FD4) correspond to the plurality of ground contact regions 223 illustrated in FIG. 2C.

In the embodiment illustrated by FIG. 2G, the first semiconductor substrate 201 is coupled to the second semiconductor substrate 251 (e.g., as shown in FIG. 2A). The second semiconductor substrate 251 includes pixel cell circuitry associated with the plurality of pixel cells of the first semiconductor substrate 201. In the illustrated embodiment, the pixel cell circuitry includes a reset transistor RST, a source-follower transistor SF, and a row select transistor RS. As illustrated by the schematic 299, each of the plurality of floating diffusion regions for the pixel cell (i.e., FD1, FD2, FD3, and FD4) are coupled together and subsequently coupled to the second semiconductor substrate 251 via a pixel-level hybrid bond (PLHB). In some embodiments, the PLHB is achieved, at least in part, by forming a corresponding floating diffusion region within the second semiconductor substrate 251 that can be coupled to the reset transistor and source-follower transistor of the second semiconductor substrate 251. Thus, in the illustrated embodiment, the pixel cell circuitry of the second semiconductor substrate 251 is coupled to the plurality of pixel cells of the first semiconductor substrate 201 on a per-pixel cell basis. However, in other embodiments, the individual floating diffusion regions (i.e., FD1, FD2, FD3, and FD4) of a given pixel cell are not coupled together and thus may be coupled to the pixel circuitry of the second semiconductor substrate 251 on a per-pixel basis.

It is appreciated that during operation, image charge photogenerated in response to incident light by the plurality of photodiodes (i.e., PD1, PD2, PD3, and PD4) can be selectively transferred to their respective floating diffusion regions (i.e., FD1, FD2, FD3, FD4) in response to a signal applied to plurality of transfer gates (i.e., TX1, TX2, TX3, and TX4), which may subsequently turn on the source-follower transistor SF supplied by AVDD of the second semiconductor substrate 251 and enable readout to the bit line via the row select transistor RS. It is appreciated the floating diffusion regions (i.e., FD1, FD2, FD3, FD4) and the plurality of photodiodes (i.e., PD1, PD2, PD3, and PD4) can be reset to a pre-determined potential (e.g., RSVDD) via the reset transistor RST. It is appreciated that while the schematic 299 is similar to the 4-T pixel driver circuit, other configurations may also be used (e.g., 3-T, 5-T, or other pixel driver configurations), in accordance with embodiments of the disclosure.

Figure 2H:
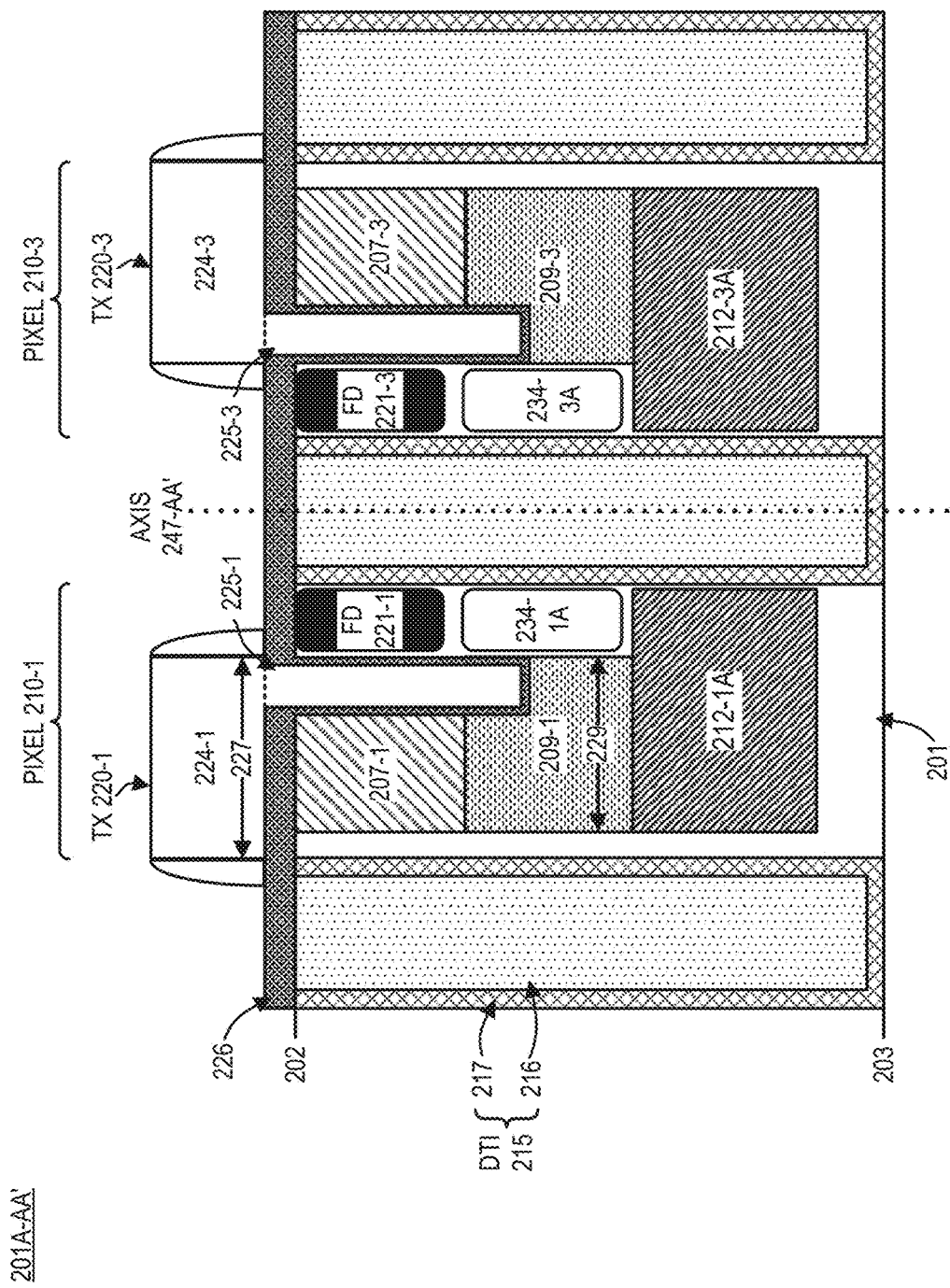
FIG. 2H, FIG. 2I, and FIG. 2J respectively represent cross-sectional views of the first semiconductor substrate along lines A-A', B-B', and C-C' shown in FIG. 2C for an alternative embodiment with increased full well capacity, in accordance with embodiments of the present disclosure.
Figure 2I:
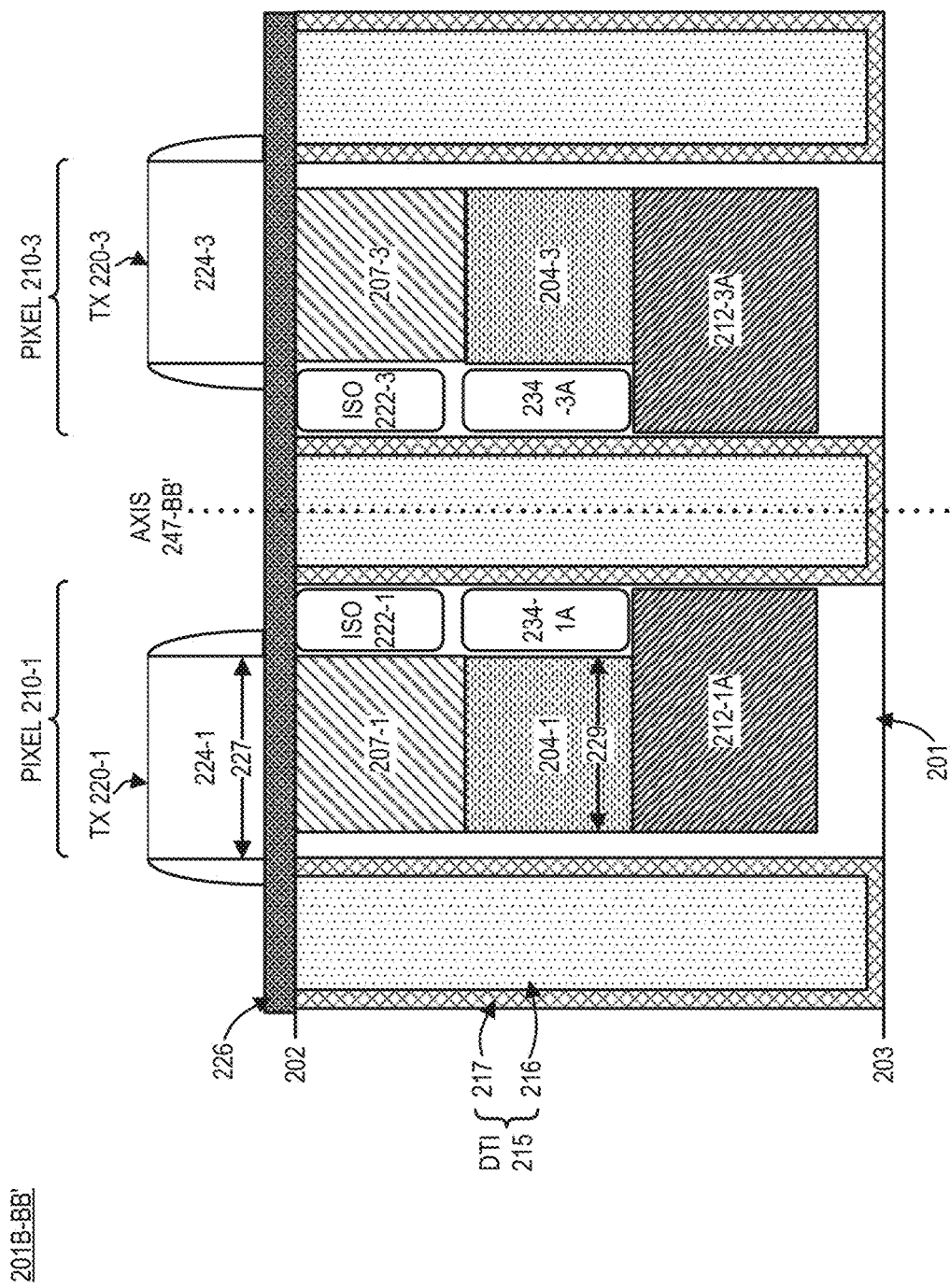
Figure 2J:
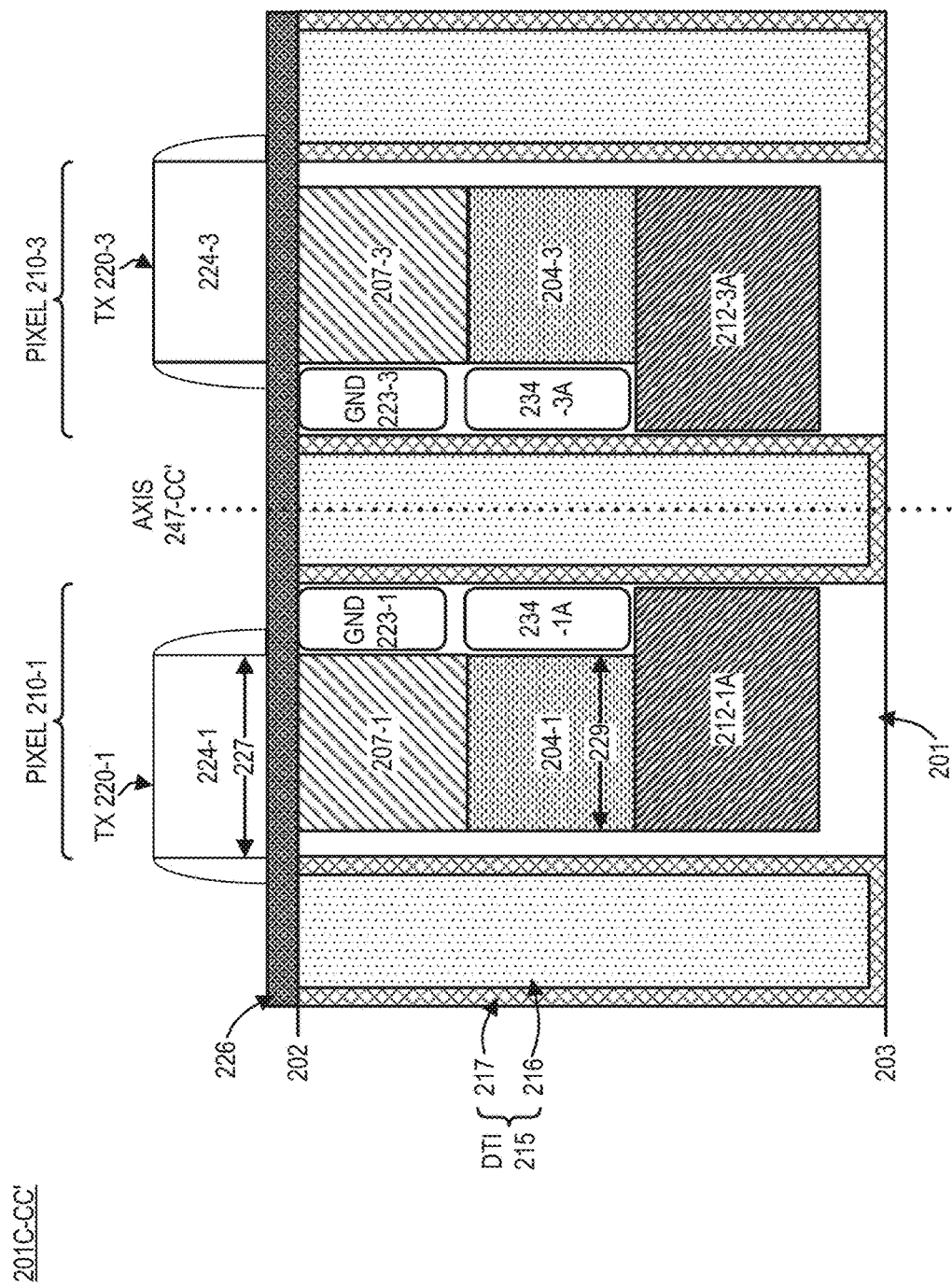

FIG. 2H, FIG. 2I, and FIG. 2J respectively represent cross-sectional views of the first semiconductor substrate 201 along lines A-A', B-B', and C-C' shown in FIG. 2C for an alternative embodiment with increased full well capacity, in accordance with embodiments of the present disclosure. More specifically, FIG. 2H illustrates cross-sectional view 201A-AA', FIG. 2I illustrates cross-sectional view 201B-BB', and FIG. 2J illustrates cross-sectional view 201C-CC' that respectively correspond to the cross-sectional view 201-AA' illustrated in FIG. 2D, the cross-sectional view 201-BB' illustrated in FIG. 2E and the cross-sectional view 201-CC' illustrated in FIG. 2F, which may include the same or similar features, elements, and the like. One difference between the views illustrated in FIGS. 2D-2F compared to the views illustrated in FIGS. 2H-2J, is that deep doped regions extend under the adjacent wells to increase the full well capacity of the associated photodiode. In the embodiment illustrated in FIGS. 2H-2J the first deep doped region 212-1A extends under the first well 234-1A and the third deep doped region 212-3A extends under the third well 234-3A. It is appreciated that the "A" suffixed to the deep doped regions and wells indicates that the suffixed element is an alternative to an already discussed element (e.g., first deep doped region 212-1A of FIG. 2H is an alternative to first deep doped region 212-A of FIG. 2D). In some embodiments, the first well 234-1A is disposed between the first floating diffusion region 221-1 and the first deep doped region 212-1A (as illustrated in FIG. 2H) and similarly, the third well 234-3A is disposed between the third floating diffusion region 221-3 and the third deep doped region 212-3A. In the same or other embodiments, the first well 234-1A is disposed between the first isolation region 222-1 and the first deep doped region 212-1A (as illustrated in FIG. 2I) and similarly, the third well 234-3A is disposed between the third isolation region 222-3 and the third deep doped region 212-3A. In the same or other embodiments, the first well 234-1A is disposed between the first ground contact region 223-1 and the first deep doped region 212-1A (as illustrated in FIG. 2J) and similarly, the third well 234-3A is disposed between the third ground contact region 223-3 and the third deep doped region 212-3A.

Figure 3A:
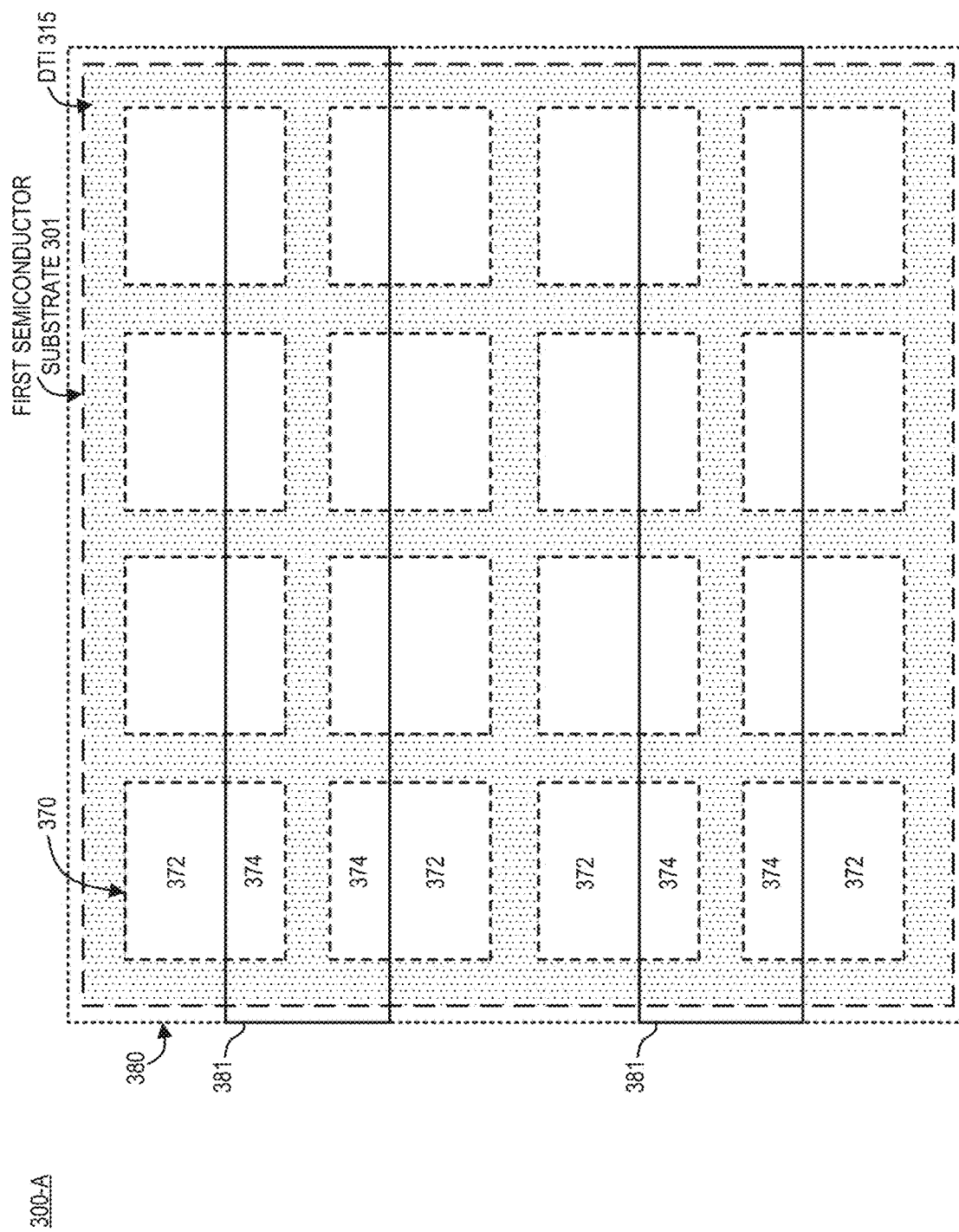
Figure 3B:
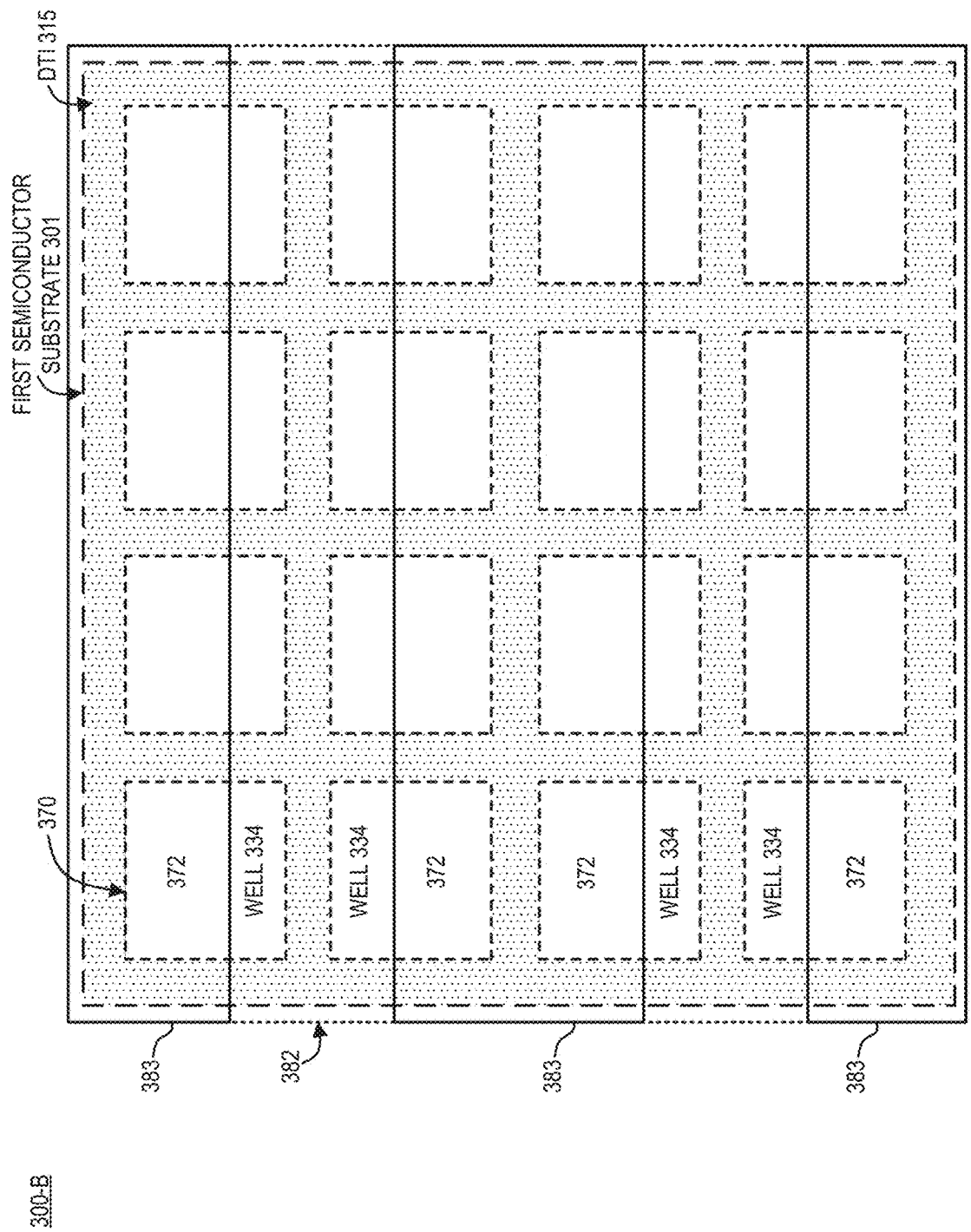
Figure 3D:
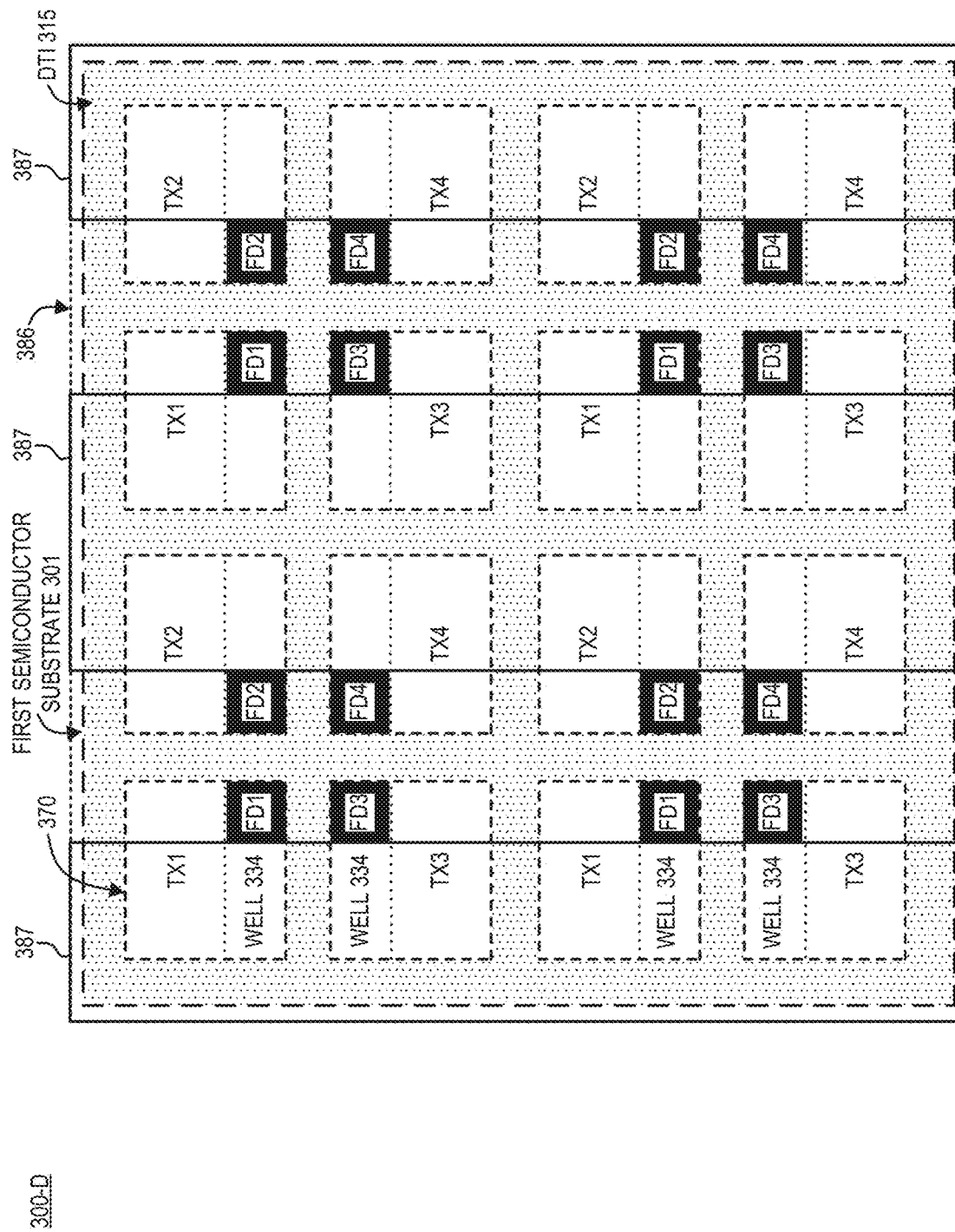
Figure 3E:
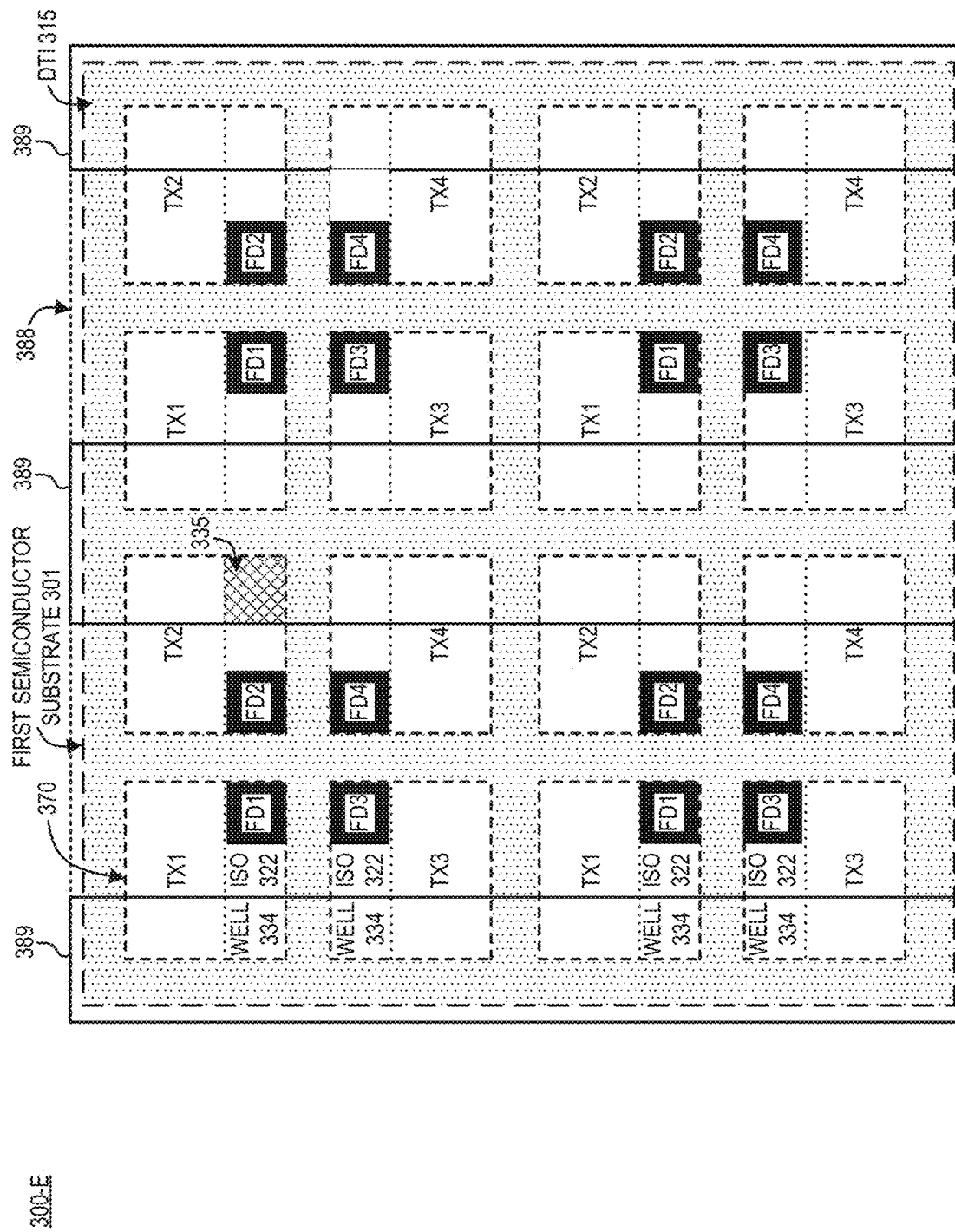
Figure 3F:
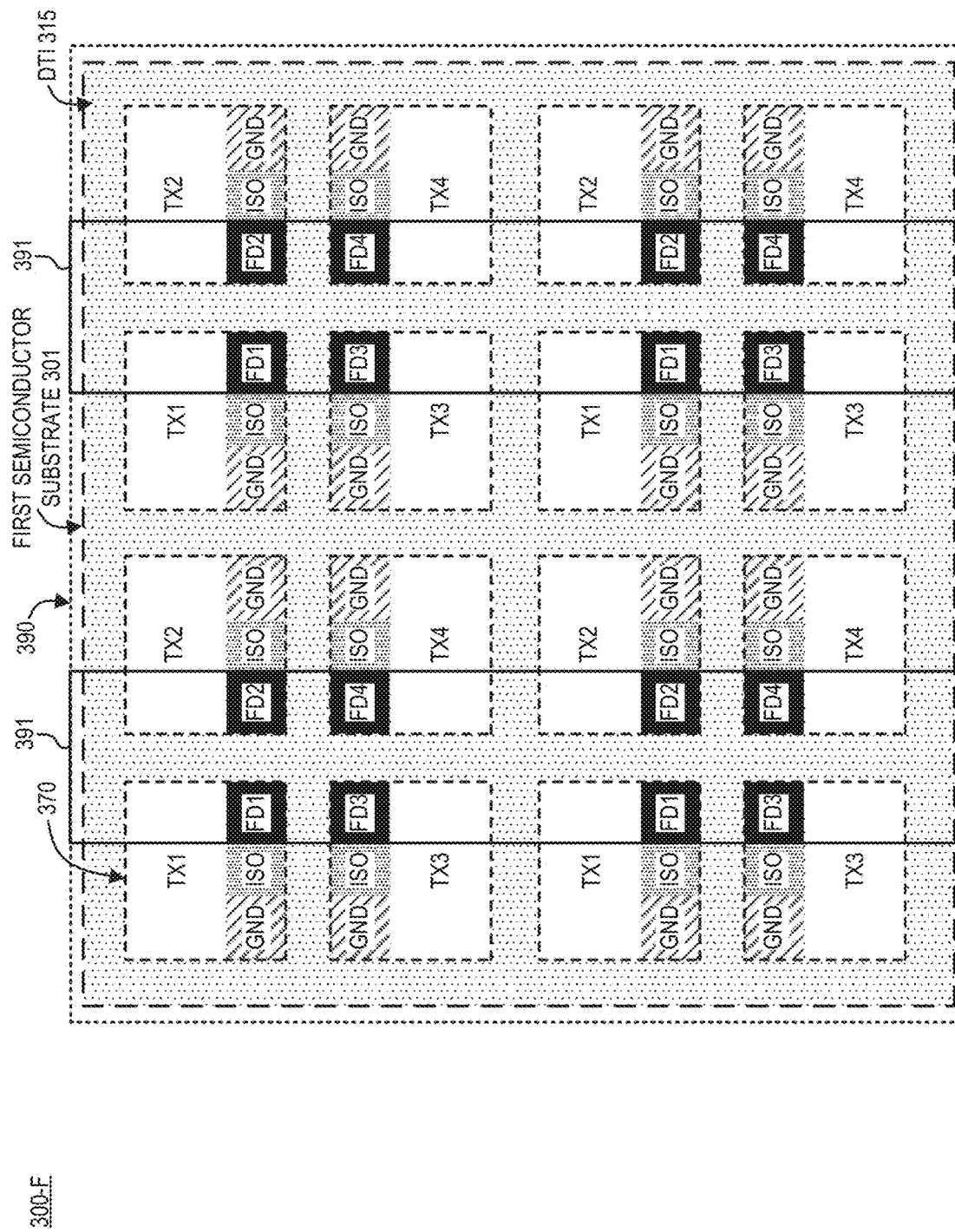
Figure 3G:
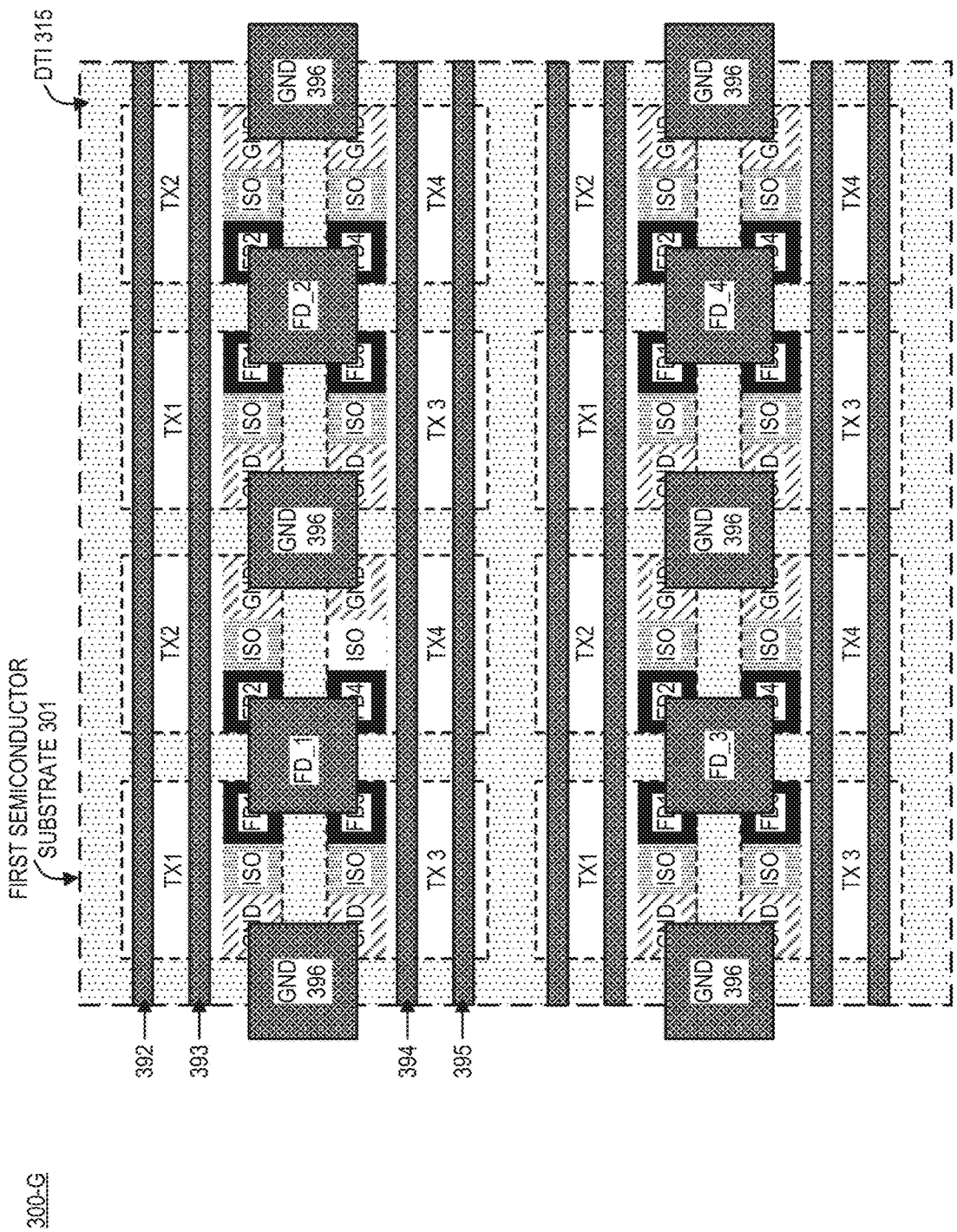

FIGS. 3A-3G illustrate an example method 300, which includes process steps 300-A illustrated in FIG. 3A, 300-B illustrated in FIG. 3B, 300-C illustrated in FIG. 3C, 300-D illustrated in FIG. 3D, 300-E illustrated in FIG. 3E, 300-F illustrated in FIG. 3F, and 300-G illustrated in FIG. 3G, for forming an image sensor structure with reduced pixel pitch, in accordance with embodiments of the disclosure. It is appreciated that the image sensor structure resultant from the method 300 is one possible process for fabricating the first semiconductor substrate 201 of the imaging system 200 illustrated in FIGS. 2A-2G. It is appreciated that while the process steps of the method 300 illustrated in FIGS. 3A-3G are provided in a specific order, in other embodiments a different order of steps 300-A through 300-G may be utilized. Additionally, process steps may be added to, or removed from, the method 300 in accordance with the embodiments of the present disclosure. The process steps illustrated in FIGS. 3A-3G may utilize conventional semiconductor device processing and microfabrication techniques known by one of ordinary skill in the art, which may include, but is not limited to, photolithography, ion implantation, chemical vapor deposition, physical vapor deposition, thermal evaporation, sputter deposition, reactive-ion etching, plasma etching, wafer bonding, chemical mechanical planarization, and the like. It is appreciated that the described techniques are merely demonstrative and not exhaustive and that other techniques may be utilized to fabricate one or more components of various embodiments of the disclosure.

FIG. 3A shows providing a first semiconductor substrate 301 including a first side and a second side, wherein the first side (e.g., a front side or a backside) is opposite the second side (e.g., backside or a front side). In the illustrated embodiment, the first semiconductor substrate 301 has a deep trench isolation (DTI) structure 315 fabricated, which may be analogous to the DTI structure 215 illustrated in FIGS. 2C-2F and include the same or similar features. The DTI structure 315 may be formed of or otherwise include polycrystalline silicon, an oxide such as silicon dioxide, a dielectric material with low refractive index relative to the refractive index of the first semiconductor substrate 201, or other insulating material. In some embodiments, the DTI structure 315 includes an inner region and an outer region (see, e.g., FIGS. 2D-2F). It is appreciated that the DTI structure 315 is structured to form a plurality of intended pixel regions 370 arranged in rows and columns that serve as intended locations for a plurality of pixels (e.g., the plurality of pixels 210 illustrated in FIGS. 2B-2G included in the plurality of pixel cells 205 illustrated in FIG. 2A) to be formed within the first semiconductor substrate 301. In some embodiments, the DTI structure 315 extends continuously from the first side to the second side (e.g., entirely through) of the first semiconductor substrate 301 and forms a trench grid structure surrounding each individual pixel cell and separating adjacent pixel cells to define a pixel cell area for each one of the plurality of pixel cells. Accordingly, the DTI structure 315 laterally surrounds and physically separates both pixels and pixel cells from one another. Additionally, edges of the DTI structure 315 may be utilized for alignment of one or more elements to be formed in or on the plurality of intended pixel regions 370 (e.g., an edge of the DTI structure 315 may be aligned with an edge of at least one of a ground contact region, an isolation region, and/or a floating diffusion region as illustrated in FIG. 3F). Additionally, or alternatively, edges of the planar region of a transfer gate (see, e.g., FIG. 3F) may be aligned with an edge of at least one of a ground contact region, an isolation region, and/or a floating diffusion region.

In the process step 300-A illustrated in FIG. 3A, a patterned photoresist layer 380 has been formed over the first semiconductor substrate 301 (e.g., proximate to the first side 202 or the second side 203 illustrated in FIG. 2D-2F). The patterned photoresist layer 380 has openings 381 with a rectangular shape that are positioned such that corners of the openings 381 do not land over the plurality of intended pixel regions 370. More specifically, the stripe pattern of the patterned photoresist layer 380 mitigates the issue of corner rounding within the patterned photoresist layer 380 due to the corners of the patterned photoresist layer 380 being positioned over the DTI structure 315 (e.g., instead of over the plurality of intended pixel regions 370 and/or an interface where the DTI structure 315 meets the plurality of intended pixel regions 370). As illustrated, for each region included in the plurality of intended pixel regions 370, a first portion 372 is positioned outside of the openings 381 while a second portion 374 is positioned within the openings 381. It is appreciated that the first portion 372 of each of the plurality of intended pixel regions 370 will be utilized to form a plurality of photodiodes and a plurality of transfer gates (see, e.g., FIG. 2C and FIG. 2D). Additionally, the second portion 374 of each of the plurality of intended pixel regions 370 will be utilized to form a plurality of floating diffusion regions, a plurality of isolation regions, a plurality of ground contact regions, and a plurality of wells (see, e.g., FIGS. 2C-2F). However, during the process step 300-A, the patterned photoresist layer 380 will be utilized to form wells (e.g., the first well 234-1 and the third well 234-3 illustrated in FIG. 2D) via ion implantation through the openings 381. In some embodiments, the ion implantation may include one or more implantation steps (e.g., a first ion implantation step of a first energy to form a middle depth well and a second ion implantation step of a second energy to form a deep depth well, which collectively may form the wells). In some embodiments, the first semiconductor substrate 301 is the second conductivity type (e.g., P-type electrical conductivity) and the one or more ion implantation steps may further increase the degree of the second conductivity type (e.g., increase dopant density) within the second portion 374 of each of the plurality of intended pixel regions 370 to form the well (e.g., first well 234-1 or third well 234-3 illustrated in FIG. 2C-2F) in the first semiconductor substrate 301 for photodiode isolation and circuit element formation.

FIG. 3B illustrates process step 300-B for forming a plurality of photodiodes disposed within the first semiconductor substrate 301 and then forming a plurality of transfer gates to cover the plurality of photodiode within the first portion 372 of each of the plurality of intended pixel regions 370. It is appreciated that the plurality of photodiodes and the plurality of transfer gates may respectively be analogous to the plurality of photodiodes 204 illustrated in FIG. 2B and the plurality of transfer gates 220 illustrated in FIG. 2C. Similarly, the wells 334 were formed during the process step 300-A illustrated in FIG. 3A and may be analogous to the plurality of wells 234 illustrated in FIGS. 2D-2F.

Referring back to FIG. 3B, a patterned photoresist layer 382 is formed over the first semiconductor substrate 301. The patterned photoresist layer 382 includes openings 383 for forming the plurality of photodiodes and the plurality of transfer gates. It is appreciated that the first portion 372 of each of the plurality of intended pixel regions 370 is exposed while the wells 334 are covered. It is further appreciated that the stripe pattern of the patterned photoresist layer 382 mitigates the issue of corner rounding within the patterned photoresist layer 382 due to the corners of the patterned photoresist layer 382 being positioned over the DTI structure 315 (e.g., instead of over the plurality of intended pixel regions 370 and/or an interface where the DTI structure 315 meets the plurality of intended pixel regions 370).

During the process step 300-B, one or more ion implantation steps (e.g., ion implantation at different implant energies to form at different depths within the first semiconductor substrate 301) to dope the first semiconductor substrate 301 within the first portion 372 of each of the plurality of intended pixel regions 370 may occur to form the plurality of photodiodes. In one embodiment, the multiple ion implantation steps may be made with alignment to the DTI structure 315 to form a deep doped region, a doped region, and a pinning region for each photodiode included in the plurality of photodiodes, which may be respectively analogous to the plurality of deep doped regions 212 (e.g., the first deep doped region 212-1 of FIG. 2D), the plurality of doped regions 209 (e.g., the first doped region 209-1 of FIG. 2D), and the plurality of pinning regions 207 (e.g., the first pinning region 207-1 of FIG. 2D). Once the plurality of photodiodes is formed, a trench may be etched within the first portion 372 of the plurality of intended pixel regions 370, an oxide layer may be formed on the first side of the first semiconductor substrate 301 (e.g., corresponding to the oxide layer 226 illustrated in FIGS. 2D-2F) lining the trench conformally and then planar and vertical regions of the plurality of transfer gates may be formed (e.g., by depositing polycrystalline silicon, a metal such as gold, aluminum, silver, copper, or other conductive material). In some embodiments, the same photoresist pattern (e.g., the patterned photoresist layer 382) is utilized to form both the plurality of photodiodes and the plurality of transfer gates. Accordingly, a lateral area of an individual one of the plurality of photodiodes is less than or equal to a lateral area of the planar region of an individual one of the plurality of transfer gates. Moreover, once the plurality of transfer gates has been formed, each transfer gate included in the plurality of transfer gate covers an underlying one of the plurality of photodiodes to protect the plurality of photodiodes from being contaminated during subsequent ion implantation steps.

FIG. 3C shows process step 300-C for forming a lightly doped region for the plurality of floating diffusion regions within the first semiconductor substrate 301 via one or more ion implantation steps to implant dopants through openings 385 of patterned photoresist layer 384. As illustrated, the openings 385 overlap with a portion of the wells 334 and the plurality of transfer gates (e.g., TX1, TX2, TX3, and TX4). However, the plurality of transfer gates blocks the ion implantation from contacting the plurality of photodiodes underlying the plurality of transfer gates. Accordingly, during the ion implantation step for the process step 300-C, the plurality of floating diffusion regions is formed in the portion 321 for each of the plurality of intended pixel regions 370 above the well 334 (see, e.g., FIG. 2D), for example, self-aligned with respect to an edge of the planar regions of each respective transfer gate and corresponding segments of DTI structure 315. It is further appreciated that the stripe pattern of the patterned photoresist layer 384 mitigates the issue of corner rounding within the patterned photoresist layer 384 due to the corners of the patterned photoresist layer 384 being positioned over the DTI structure 315 (e.g., instead of over the plurality of intended pixel regions 370 and/or an interface where the DTI structure 315 meets the plurality of intended pixel regions 370). This is because the openings 385 extend beyond an intended location of the floating diffusion regions (e.g., the portion 321 of the first semiconductor substrate 301 for each of the plurality of intended pixel regions 370) such that corners of the openings 385 do not overlap with any of the plurality of transfer gates or the intended location of the plurality of floating diffusion regions.

FIG. 3D illustrates process step 300-D for forming a plurality of isolation regions (e.g., shallow wells of the second conductivity type) within the first semiconductor substrate 301 via one or more ion implantation steps to implant dopants through openings 387 of patterned photoresist 386. In some embodiments, the plurality of isolation regions is analogous to the plurality of isolation regions 222 illustrated in FIG. 2C. It is appreciated that the plurality of isolation regions may be formed via a patterned photoresist layer 386 with openings 387. As illustrated, the openings 387 overlap with the wells 334 and a portion of the plurality of transfer gates (e.g., TX1, TX2, TX3, and TX4), but do not overlap with the plurality of floating diffusion regions (e.g., FD1, FD2, FD3, and FD4). During the ion implantation of the process step 300-D, the plurality of transfer gates blocks the ion implantation from contacting the plurality of photodiodes underlying the plurality of transfer gates. Accordingly, during the ion implantation step for the process 300-D, the second conductivity type may be implanted above the well 334 with alignment to an edge of the planar regions of respective transfer gates to form the plurality of isolation regions for each of the plurality of intended pixel regions 370 (see, e.g., FIG. 2E). It is further appreciated that the stripe pattern of the patterned photoresist layer 386 mitigates the issue of corner rounding within the patterned photoresist layer 386 due to the corners of the patterned photoresist layer 386 being positioned over the DTI structure 315 (e.g., instead of over the plurality of intended pixel regions 370 and/or an interface where the DTI structure 315 meets the plurality of intended pixel regions 370). This is because the openings 387 extend beyond an intended location of the plurality of isolation regions (e.g., above the wells 334 for each of the plurality of intended pixel regions 370) such that corners of the openings 387 do not overlap with any of the plurality of transfer gates or the intended location of the plurality of isolation regions.

FIG. 3E shows process step 300-E for forming a plurality of ground contact regions (e.g., highly doped regions of the second conductivity type with a dopant concentration greater than the first semiconductor substrate 301) within the first semiconductor substrate 301 via one or more ion implantation steps to implant dopants through openings 389 of patterned photoresist layer 388. In some embodiments, the ground contact regions are implemented with alignment made with respect to at least one of an edge of the planar gate region of respective transfer gates and corresponding segments of the DTI structure 315. In some embodiments, the plurality of ground contact regions is analogous to the plurality of ground contact regions 223 illustrated in FIG. 2C. As illustrated, the openings 389 overlap with portions 335 of the wells 334 such that the plurality of ground contact regions may be formed above the wells 334 within the regions 335 of the first semiconductor substrate 301 (e.g., as illustrated in FIG. 2F, which shows the plurality of ground contact regions 223 disposed, at least in part, between the first side 202 of the first semiconductor substrate 201 and the plurality of wells 234). It is noted that the openings 389 overlap with the portions 335 of the first semiconductor substrate 301 above the plurality of wells 334 and respective portions of the plurality of transfer gates (e.g., TX1, TX2, TX3, and TX4), but do not overlap with the plurality of floating diffusion regions (e.g., FD1, FD2, FD3, and FD4) or the plurality of isolation regions 322. During the one or more ion implantation steps of the process step 300-E, the plurality of transfer gates blocks the ion implantation from contacting or otherwise reaching the plurality of photodiodes underlying the plurality of transfer gates. Accordingly, during the one or more ion implantation steps for the process 300-E, the second conductivity type may be implanted with a high concentration (e.g., P+ dopant concentration such that the portions 335 become sufficiently conductive) above the wells 334 to form the plurality of ground contact regions for each of the plurality of intended pixel regions 370 (see, e.g., FIG. 2F). It is further appreciated that the stripe pattern of the patterned photoresist layer 388 mitigates the issue of corner rounding within the patterned photoresist layer 388 due to the corners of the patterned photoresist layer 388 being positioned over the DTI structure 315 (e.g., instead of over the plurality of intended pixel regions 370 and/or an interface where the DTI structure 315 meets the plurality of intended pixel regions 370). This is because the openings 389 extend beyond an intended location of the plurality of ground contact regions (e.g., above the wells 334 for each of the plurality of intended pixel regions 370 within the portions 335 of the first semiconductor substrate 301) such that corners of the openings 389 do not overlap with any of the plurality of transfer gates or the intended location of the plurality of ground contact regions.

FIG. 3F shows process step 300-F for ion implantation to form heavily doped region of the plurality of floating diffusion regions (e.g., doped regions of the first conductivity type to form the plurality of floating diffusion regions in the previously formed lightly doped region denoted as FD1, FD2, FD3, and FD4) within the first semiconductor substrate 301 via one or more ion implantation steps to implant dopants through openings 391 of patterned photoresist layer 390. In some embodiments, the plurality of floating diffusion regions is analogous to the plurality of floating diffusion regions 221 illustrated in FIG. 2C. As illustrated, the openings 391 overlap with the floating diffusion regions formed during process step 300-C illustrated in FIG. 3C such that heavily doped regions can be formed over, or partially within, the plurality of floating diffusion regions. It is noted that the openings 391 overlap with the plurality of floating diffusion regions of the first semiconductor substrate 301 and respective portions of the plurality of transfer gates (e.g., TX1, TX2, TX3, and TX4), but do not overlap with the plurality of isolation regions (e.g., denoted as "ISO") or the plurality of ground contact regions (e.g., denoted as "GND"). During one or more ion implantation steps of the process step 300-F, the plurality of transfer gates blocks the ion implantation from contacting or otherwise reaching the plurality of photodiodes underlying the plurality of transfer gates. Accordingly, during the one or more ion implantation steps for the process 300-F, the first conductivity type may be implanted (e.g., N-type dopant) to form the source/drain of the plurality of floating diffusion regions of the intended pixel regions 370. It is further appreciated that the stripe pattern of the patterned photoresist layer 390 mitigates the issue of corner rounding within the patterned photoresist layer 390 due to the corners of the patterned photoresist layer 390 being positioned over the DTI structure 315 (e.g., instead of over the plurality of intended pixel regions 370 and/or an interface where the DTI structure 315 meets the plurality of intended pixel regions 370). This is because the openings 391 extend beyond an intended location of the plurality of floating diffusion regions or their respective source/drain such that corners of the openings 391 do not overlap with any of the plurality of transfer gates or the intended location of the source/drain for the plurality of floating diffusion regions.

FIG. 3G illustrates process step 300-G, which is an example back end of the line design for a first metal (M1) layer, which is formed by a pattern of photoresist (not illustrated). In the illustrated embodiment, the M1 layer shows floating diffusion regions for a given pixel cell coupled together (e.g., FD1, FD2, FD3, and FD4 for a first pixel cell are coupled together via contact and metal interconnect FD_1, FD1, FD2, FD3, and FD4 for a second pixel cell are coupled together via contact and metal interconnect FD_2, FD1, FD2, FD3, and FD4 for a third pixel cell are coupled together via contact and metal interconnect FD_3, and FD1, FD2, FD3, and FD4 for a fourth pixel cell are coupled together via metal contact FD_4). Similarly, ground contact regions of adjacent pixel cells are coupled together (e.g., via contact and metal interconnect GND 396). However, it is appreciated that in some embodiments, a subsequent metal layer (e.g., a second metal layer "M2") may couple all ground contact regions of all pixel cells together. The M1 layer also includes metal traces 392, 393, 394, and 395, which respectively couple the plurality of transfer gates for a respective row together. In some embodiments, metal trace 392 couples transfer gates included in the plurality of transfer gates of a given row denoted as "TX1" together while metal trace 393 couples transfer gates of the given row denoted as "TX2" together. Similarly, in the same or other embodiments, metal trace 394 couples transfer gates included in the plurality of transfer gates of a given row denoted as "TX3" together while metal trace 395 couples transfer gates of the given row denoted as "TX4" together. In other words, transfer gates included in the plurality of transfer gates along a common row may not necessarily be coupled together (e.g., TX1 and TX2 of the common row may not be electrically coupled together via the metal traces 392 or 393). In other embodiments, transfer gates included in the plurality of transfer gates of a common row may be coupled together.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel cell for an image sensor, the pixel cell comprising:
 a first semiconductor substrate including a first side and a second side, wherein the first side is opposite the second side;
 a photodiode disposed within the first semiconductor substrate between the first side and the second side; and
 a transfer gate disposed proximate to the first side of first semiconductor substrate, wherein the transfer gate includes a planar region, wherein the first side of the first semiconductor substrate is disposed between the planar region and the photodiode, and wherein a lateral area of the photodiode is less than or equal to a lateral area of the planar region of the transfer gate.

2. The pixel cell of claim 1, wherein the transfer gate is optically aligned with the photodiode such that the planar region of the transfer gate laterally extends over the photodiode to cover an entirety of the lateral area of the photodiode when the first semiconductor substrate is viewed from the first side.

3. The pixel cell of claim 1, wherein the transfer gate further includes a vertical region extending from the planar region into the first semiconductor substrate towards the second side of the first semiconductor substrate.

4. The pixel cell of claim 3, wherein the photodiode includes a pinning region disposed proximate to the first side of the first semiconductor substrate, and wherein the vertical region of the transfer gate is disposed between the pinning region and a floating diffusion region.

5. The pixel cell of claim 3, wherein the photodiode includes a doped region of a first conductivity type opposite of a second conductivity type of the first semiconductor substrate, wherein the vertical region of the transfer gate is disposed between the planar region of the transfer gate and the doped region, wherein the lateral area of the photodiode is based on the doped region, and wherein the planar region of the transfer gate laterally extends over the first doped region of the photodiode to cover an entirety of the lateral area of the doped region when the first semiconductor substrate is viewed from the first side.

6. The pixel cell of claim 1, wherein the photodiode and the transfer gate form a first pixel included in a plurality of pixels of the pixel cell, wherein the pixel cell further comprises a deep trench isolation (DTI) structure laterally surrounding the first pixel, wherein the DTI structure extends continuously from the first side of the first semiconductor substrate to the second side of the first semiconductor substrate to physically separate the first pixel from adjacent pixels included in the plurality of pixels of the pixel cell.

7. The pixel cell of claim 6, wherein the adjacent pixels included in the pixel cell includes a second pixel adjacent to the first pixel, wherein the first pixel includes a first floating diffusion region, wherein the second pixel includes a second floating diffusion region, and wherein the DTI structure is disposed between the first floating diffusion region of the first pixel and the second floating diffusion region of the second pixel.

8. The pixel cell of claim 7, wherein the first floating diffusion region of the first pixel abuts the DTI structure, and wherein the second floating diffusion region of the second pixel abuts the DTI structure.

9. The pixel cell of claim 1, further comprising a ground contact region, an isolation region, and a floating diffusion region, each disposed within the first semiconductor substrate proximate to the first side of the first semiconductor substrate, wherein the isolation region is disposed between the ground contact region and the floating diffusion region, and wherein the photodiode, the transfer gate, the ground contact region, and the floating diffusion region collectively form a first pixel included in a plurality of pixels of the pixel cell.

10. The pixel cell of claim 9, wherein pixels included in the plurality of pixels are arranged in rows and columns to form a pixel array, the pixels including at least the first pixel, a second pixel, a third pixel, and a fourth pixel that collectively form a two-by-two pixel array of the pixel cell, and wherein the two-by-two pixel array is mirror symmetric about a first axis.

11. The pixel cell of claim 10, wherein the two-by-two pixel array is mirror symmetric about a second axis, and wherein the second axis is orthogonal to the first axis.

12. The pixel cell of claim 10, wherein the second pixel, the third pixel, and the fourth pixel each include respective instances of the photodiode, the transfer gate, the ground contact region, and the floating diffusion region, wherein the floating diffusion region for each of the first pixel, the second pixel, the third pixel, and the fourth pixel are separated by a deep trench isolation (DTI) structure and electrically coupled together, wherein the DTI structure extends continuously from the first side of the first semiconductor substrate to the second side of the first semiconductor substrate.

13. The pixel cell of claim 9, further comprising:
a second semiconductor substrate coupled to the first semiconductor substrate, wherein the second semiconductor substrate includes a pixel cell circuitry associated with the plurality of pixels of the first semiconductor substrate, and wherein pixels included in the plurality of pixels are coupled to the pixel cell circuitry on at least a per-pixel cell basis.

14. An image sensor, comprising:
a pixel cell formed in or on a first semiconductor substrate, wherein the pixel cell includes a plurality of pixels, each pixel included in the plurality of pixels including:
a photodiode disposed within the first semiconductor substrate between a first side and a second side of the first semiconductor substrate;
a transfer gate disposed proximate to the first side of first semiconductor substrate, wherein the transfer gate includes a planar region, and wherein the first side of the first semiconductor substrate is disposed between the planar region of the transfer gate and the photodiode; and
a ground contact region, an isolation region, and a floating diffusion region, each disposed within the first semiconductor substrate proximate to the first side of the first semiconductor substrate and the photodiode; and
pixel cell circuitry formed in or on a second semiconductor substrate, wherein the pixel cell circuitry is coupled to the plurality of pixels on at least a per-pixel cell basis.

15. The image sensor of claim 14, wherein the isolation region is disposed between the ground contact region and the floating diffusion region for each pixel included in the plurality of pixels.

16. The image sensor of claim 14, wherein the pixel cell is mirror symmetric about a first axis.

17. The image sensor of claim 16, wherein the pixel cell is mirror symmetric about a second axis, and wherein the second axis is orthogonal to the first axis.

18. The image sensor of claim 14, wherein for each pixel included in the pixel cell, the transfer gate is optically aligned with the photodiode such that the planar region of the transfer gate laterally extends over the photodiode to cover an entirety of a lateral area of the photodiode when the first semiconductor substrate is viewed from the first side.

19. The image sensor of claim 14, wherein for each pixel included in the pixel cell, the transfer gate further includes a vertical region extending from the planar region into the first semiconductor substrate towards the second side of the first semiconductor substrate, wherein the vertical region of the transfer gate is disposed between the photodiode and the floating diffusion region.

20. The image sensor of claim 14, further comprising a deep trench isolation (DTI) structure laterally surrounding the pixel cell to physically separate the pixel cell from one or more additional pixel cells adjacent to the pixel cell, wherein the deep trench isolation structure extends continuously from the first side of the first semiconductor substrate to the second side of the first semiconductor substrate.

21. The image sensor of claim 20, wherein the DTI structure further surrounds each of the plurality of pixels included in the pixel cell to separate the plurality of pixels from one another, wherein the ground contact region, the isolation region, and the floating diffusion region are disposed between the transfer gate and the DTI structure for each pixel included in the plurality of pixels of the pixel cell.

22. A method for forming an image sensor, the method comprising:
providing a first semiconductor substrate including a first side and a second side, wherein the first side is opposite the second side;
forming a photodiode disposed within the first semiconductor substrate between the first side and the second side; and
forming a transfer gate disposed proximate to the first side of the first semiconductor substrate, wherein the transfer gate includes a planar region, wherein the first side of the first semiconductor substrate is disposed between the planar region and the photodiode, and wherein a lateral area of the photodiode is less than or equal to a lateral area of the planar region of the transfer gate.

23. The method of claim 22, further comprising:
forming a deep trench isolation structure extending continuously from the first side of the first semiconductor substrate to the second side of the first semiconductor substrate, wherein the deep trench isolation structure laterally surrounds the photodiode and the transfer gate to physically separate a pixel cell including the photodiode from one or more additional pixel cells adjacent to the pixel cell;

forming at least one of a ground contact region, an isolation region, or a floating diffusion region disposed within the first semiconductor substrate proximate to the first side of the first semiconductor substrate via implantation, wherein an edge of the at least one of the ground contact region, the isolation structure, or the floating diffusion region is aligned with at least one of an edge of the planar region or an edge of the deep trench isolation structure, and wherein the forming the at least one of the ground contact region, the isolation region, or the floating diffusion region includes:

forming a photoresist layer with at least one opening on the first side of the first semiconductor substrate, and wherein the at least one opening extends beyond an intended location of the ground contact region, the isolation region, or the floating diffusion region such that corners of the at least one opening do not overlap with any of the transfer gate or the intended location of the ground contact region, the isolation region, or the floating diffusion region.

* * * * *